United States Patent
Roh et al.

(10) Patent No.: US 11,796,587 B2
(45) Date of Patent: Oct. 24, 2023

(54) DEFECT DETECTION STRUCTURES, SEMICONDUCTOR DEVICES INCLUDING THE SAME, AND METHODS OF DETECTING DEFECTS IN SEMICONDUCTOR DIES

(71) Applicant: Samsung Electronics Co., Ltd., Suwon-si (KR)

(72) Inventors: Junghyun Roh, Asan-si (KR); Minjae Lee, Suwon-si (KR); Unho Cha, Asan-si (KR)

(73) Assignee: Samsung Electronics Co., Ltd.

( * ) Notice: Subject to any disclaimer, the term of this patent is extended or adjusted under 35 U.S.C. 154(b) by 627 days.

(21) Appl. No.: 17/061,380

(22) Filed: Oct. 1, 2020

(65) Prior Publication Data

US 2021/0311104 A1 Oct. 7, 2021

(30) Foreign Application Priority Data

Apr. 3, 2020 (KR) .................. 10-2020-0040758

(51) Int. Cl.
*G01R 31/26* (2020.01)
*H01L 23/50* (2006.01)
(Continued)

(52) U.S. Cl.
CPC .......... *G01R 31/2607* (2013.01); *H01L 23/50* (2013.01); *H01L 23/5226* (2013.01); *H01L 23/5283* (2013.01); *H01L 23/552* (2013.01)

(58) Field of Classification Search
CPC . G01R 31/2607; H01L 23/50; H01L 23/5226; H01L 23/5283; H01L 23/552
(Continued)

(56) References Cited

U.S. PATENT DOCUMENTS

| 8,324,908 B2 | 12/2012 | Tsai et al. |
| 9,223,450 B2 | 12/2015 | Heo et al. |

(Continued)

FOREIGN PATENT DOCUMENTS

| JP | 2001250825 A | 9/2001 |
| JP | 2008235296 A | 10/2008 |

(Continued)

*Primary Examiner* — Tu-Tu V Ho
(74) *Attorney, Agent, or Firm* — Fish & Richardson P.C.

(57) ABSTRACT

A semiconductor device includes a semiconductor die, a defect detection structure and an input-output circuit. The semiconductor die includes a central region and a peripheral region surrounding the central region. The peripheral region includes a left-bottom corner region, a left-upper corner region, a right-upper corner region and a right-bottom corner region. The defect detection structure is formed in the peripheral region. The defect detection structure includes a first conduction loop passing through the left-bottom corner region, a second conduction loop passing through the right-bottom corner region, a third conduction loop passing through the left-bottom corner region and the left-upper corner region, a fourth conduction loop passing through the right-bottom corner region and the right-upper corner region, and a shielding loop to shield electrical interference between the first through fourth conduction loops. The input-output circuit is electrically connected to end nodes of the first conduction loop, the second conduction loop, the third conduction loop and the fourth conduction loop.

20 Claims, 37 Drawing Sheets

(51) Int. Cl.
  *H01L 23/552* (2006.01)
  *H01L 23/528* (2006.01)
  *H01L 23/522* (2006.01)

(58) Field of Classification Search
  USPC .......................................................... 257/48
  See application file for complete search history.

(56) References Cited

U.S. PATENT DOCUMENTS

| | | |
|---|---|---|
| 10,418,325 B2 | 9/2019 | Nishida et al. |
| 11,342,234 B2 * | 5/2022 | Kim ........................ H10B 41/27 |
| 2016/0254200 A1 | 9/2016 | Zundel et al. |

FOREIGN PATENT DOCUMENTS

| | | |
|---|---|---|
| JP | 4919475 B2 | 2/2012 |
| JP | 5207456 B2 | 3/2013 |
| KR | 100960457 B1 | 5/2010 |
| KR | 20160108930 A | 9/2016 |

* cited by examiner

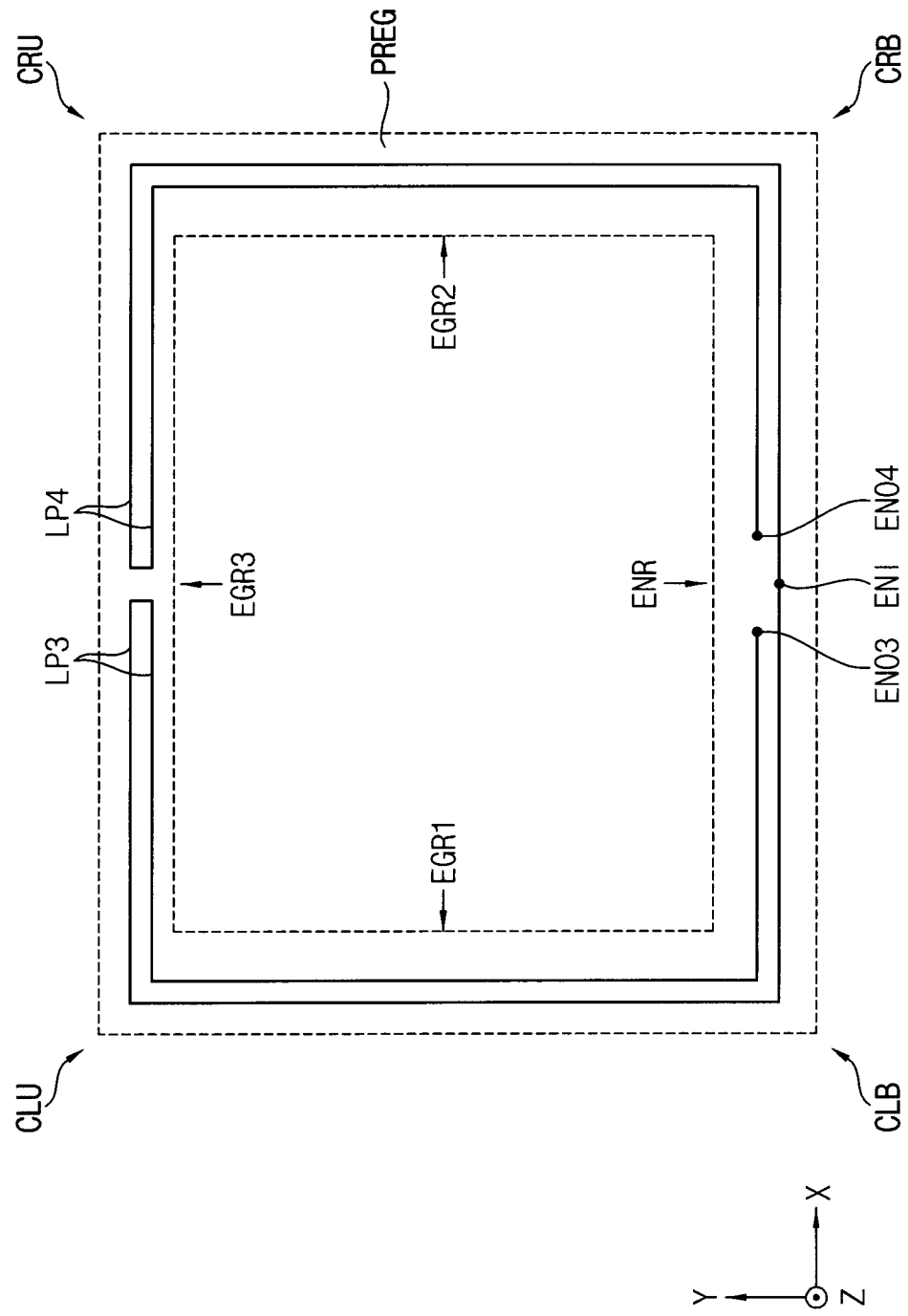

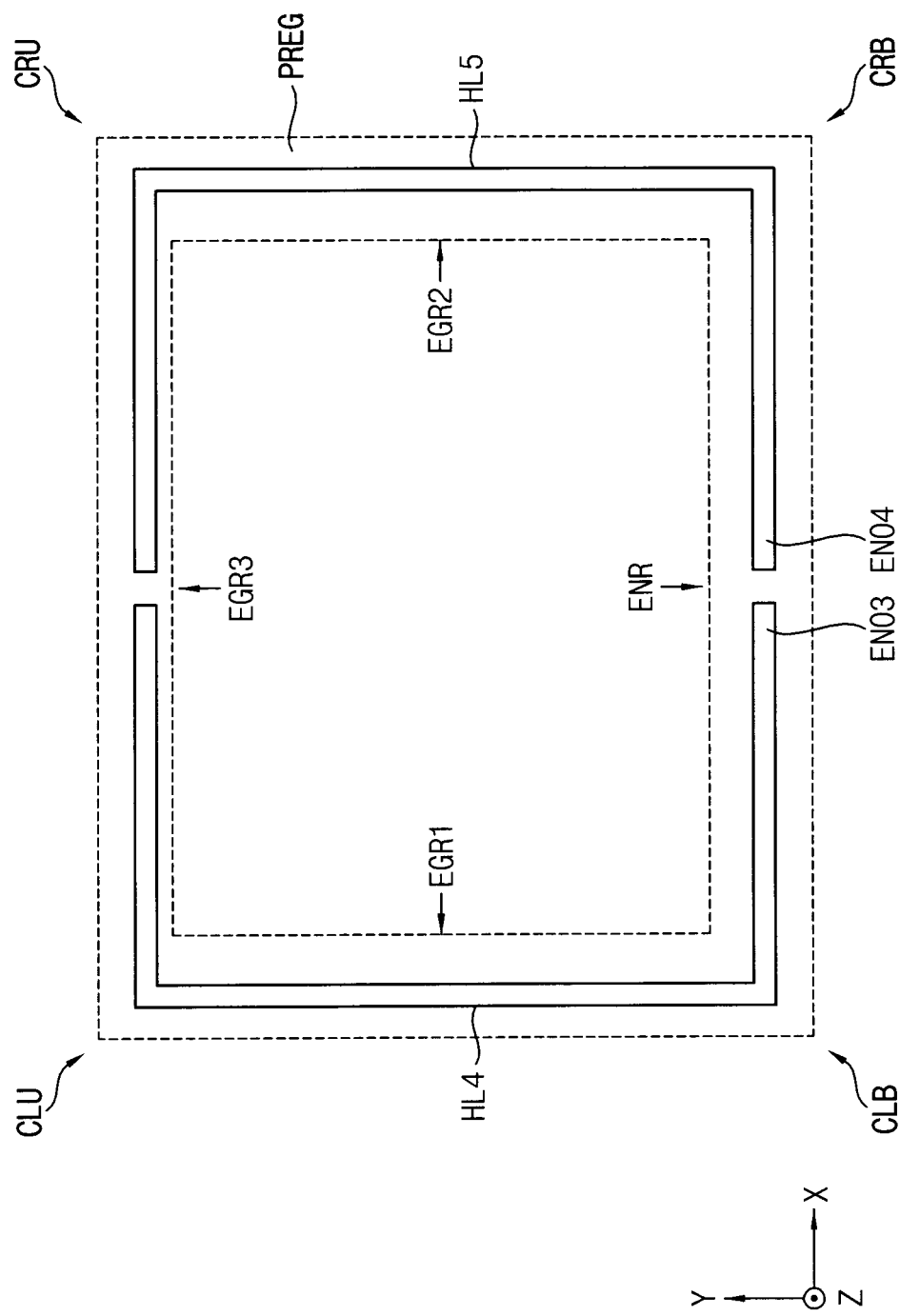

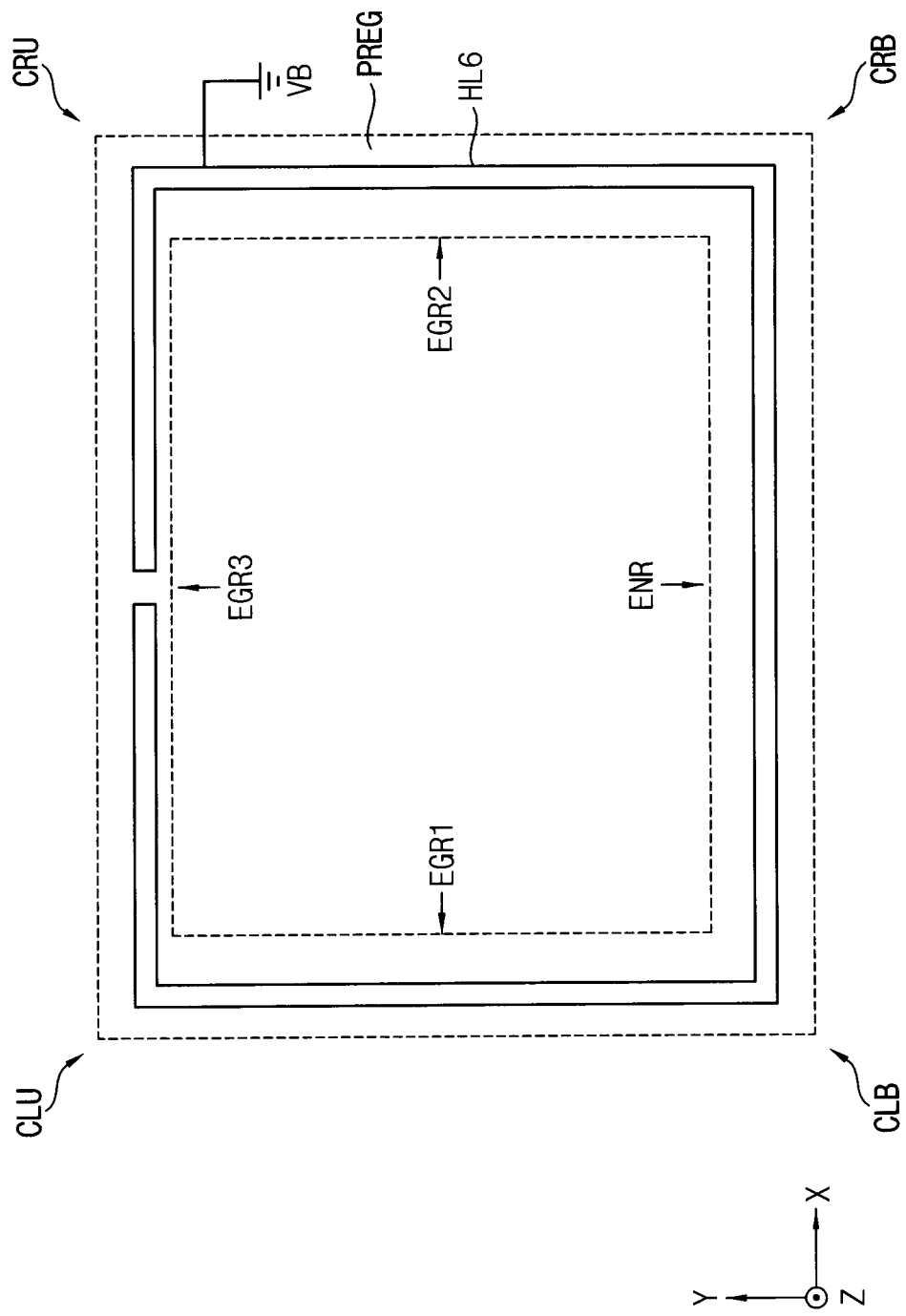

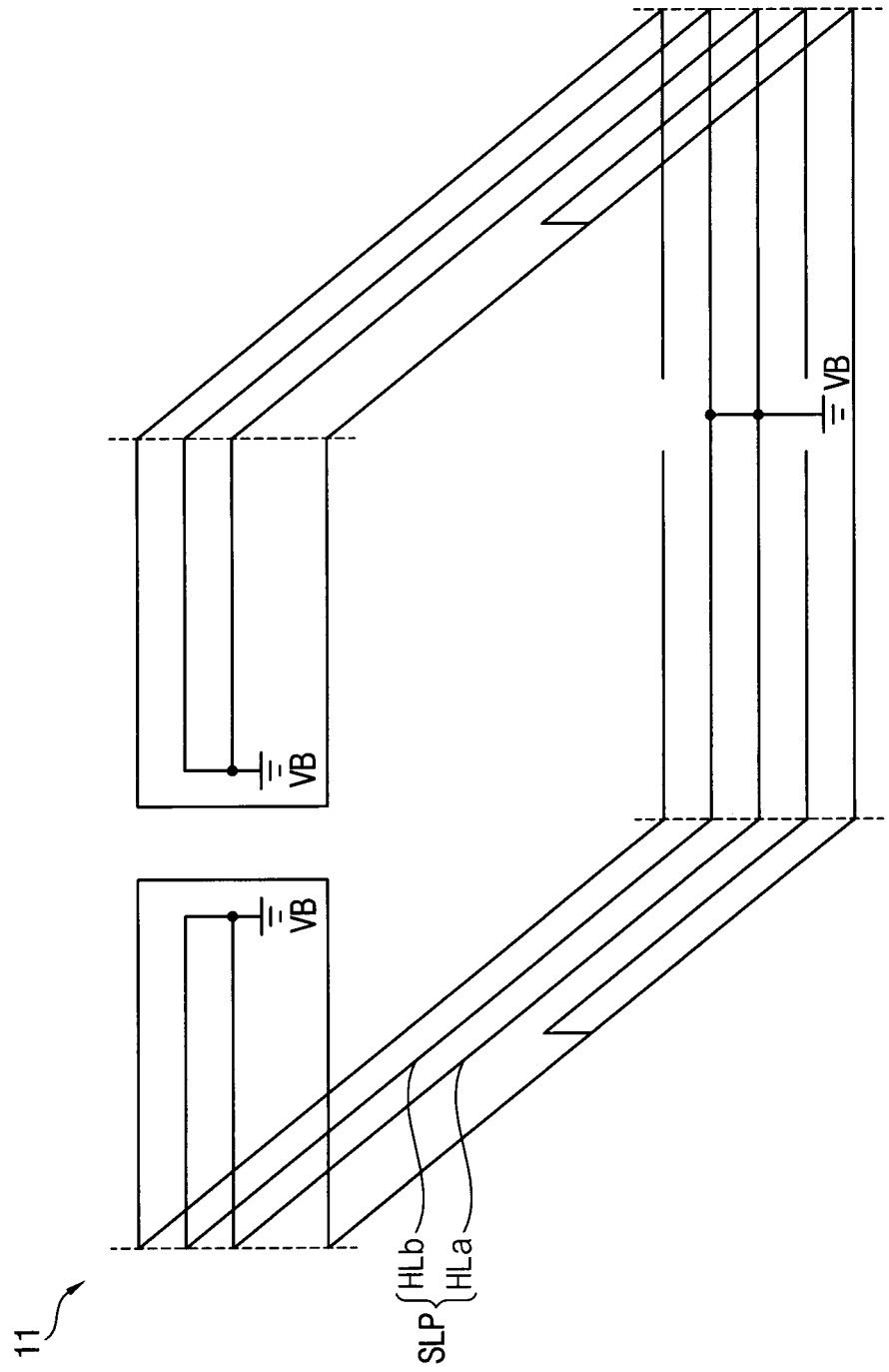

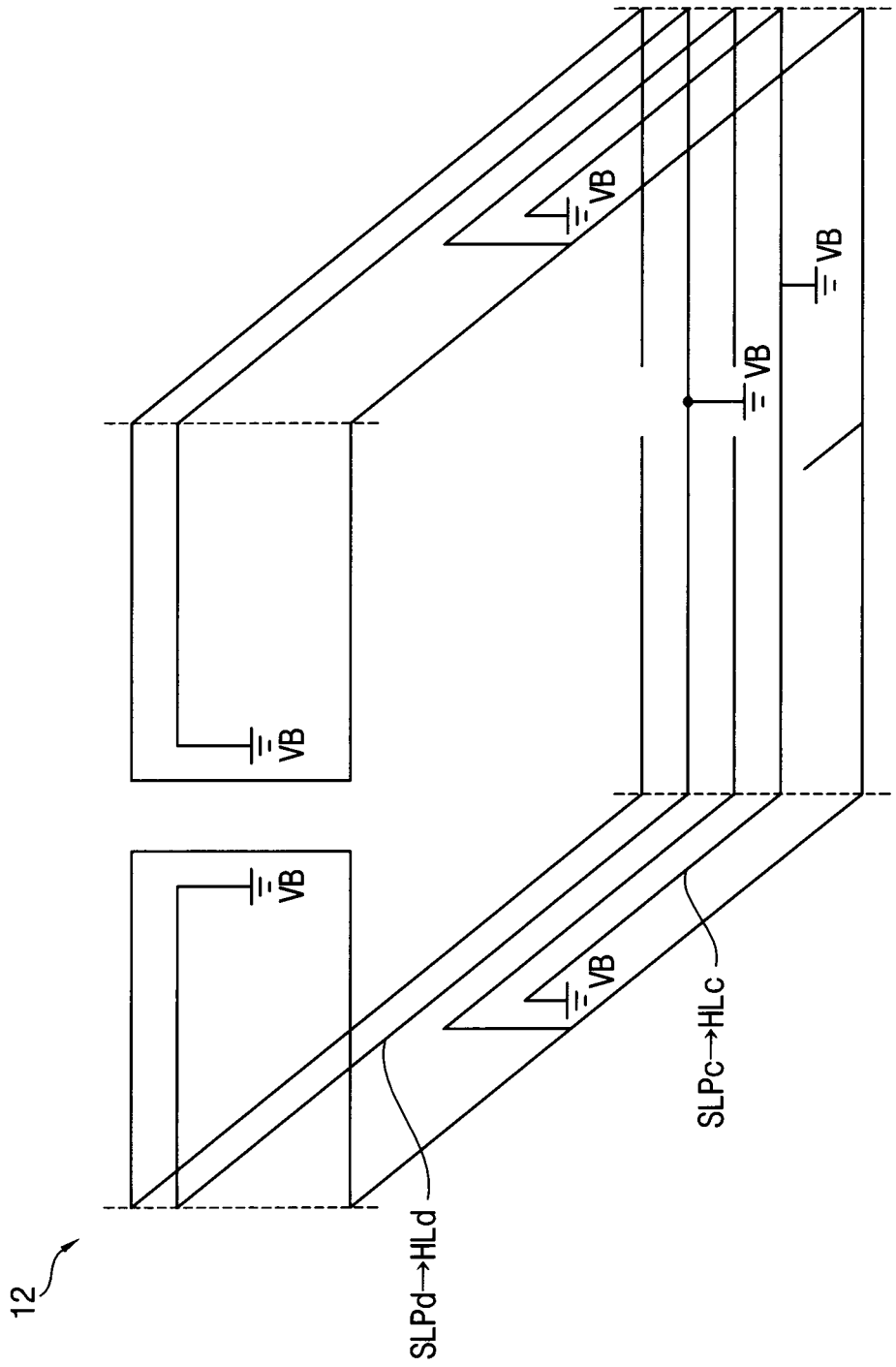

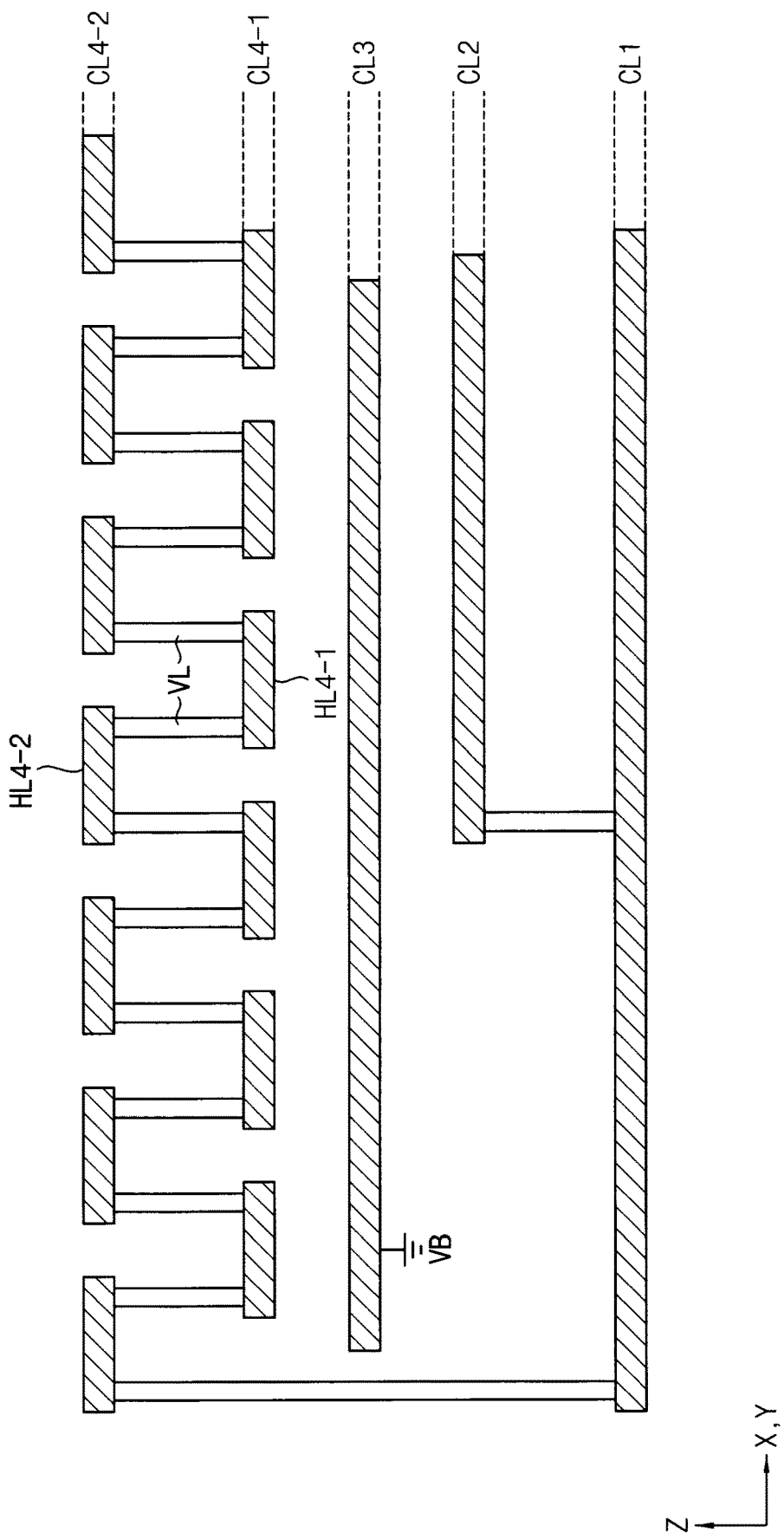

| POSITION | LP1 | LP2 | LP3 | LP4 |
|---|---|---|---|---|
| CR1 | DEL | NOR | DEL | NOR |
| CR2 | NOR | DEL | NOR | DEL |
| CR3 | NOR | NOR | DEL | NOR |
| CR4 | NOR | NOR | NOR | DEL |

DEFECT DETECTION STRUCTURES, SEMICONDUCTOR DEVICES INCLUDING THE SAME, AND METHODS OF DETECTING DEFECTS IN SEMICONDUCTOR DIES

REFERENCE TO PRIORITY APPLICATION

This U.S. Non-provisional application claims priority under 35 USC § 119 to Korean Patent Application No. 10-2020-0040758, filed on Apr. 3, 2020, in the Korean Intellectual Property Office (KIPO), the disclosure of which is hereby incorporated herein by reference in its entirety herein.

BACKGROUND

1. Technical Field

Example embodiments relate generally to semiconductor integrated circuits and, more particularly, to semiconductor integrated circuits having structures therein that support detection of defects therein and methods of operating such structures.

2. Discussion of the Related Art

In general, integrated circuits are manufactured by forming repeated patterns in a wafer of semiconductor material. The wafer may be cut or diced into a plurality of semiconductor dies, and the respective semiconductor die may be packaged into a semiconductor chip. Cracks may occur in the semiconductor die during the cutting and packaging processes. To reduce yield of defective products, the semiconductors are inspected to detect the cracks.

SUMMARY

Some example embodiments may provide a defect detection structure of a semiconductor die and a semiconductor device including a defect detection structure for enhancing detectability of various types of crack penetration and other defects.

Some example embodiments may provide a method of detecting defects in a semiconductor die for enhancing detectability of crack penetration of various types.

According to example embodiments, a semiconductor device includes a semiconductor die, a defect detection structure and an input-output circuit. The semiconductor die includes a central region in which a semiconductor integrated circuit is formed and a peripheral region surrounding the central region. The peripheral region includes a left-bottom corner region, a left-upper corner region, a right-upper corner region and a right-bottom corner region. The defect detection structure is formed in the peripheral region. The defect detection structure includes a first conduction loop passing through the left-bottom corner region, a second conduction loop passing through the right-bottom corner region, a third conduction loop passing through the left-bottom corner region and the left-upper corner region, and a fourth conduction loop passing through the right-bottom corner region and the right-upper corner region. A shielding loop is also provided to at least partially shield the first through fourth conduction loops from electrical interference therebetween. The input-output circuit is electrically connected to respective end nodes of the first conduction loop, the second conduction loop, the third conduction loop and the fourth conduction loop.

According to example embodiments, a defect detection structure is formed in a peripheral region of a semiconductor die surrounding a central region of the semiconductor die in which a semiconductor integrated circuit is formed, The defect detection structure includes a first conduction loop passing through a left-bottom corner region of the peripheral region, a second conduction loop passing through a right-bottom corner region of the peripheral region, a third conduction loop passing through the left-bottom corner region and a left-upper corner region of the peripheral region, and a fourth conduction loop passing through the right-bottom corner region and a right-upper corner region of the peripheral region. A shielding loop is also advantageously provided to at least partially shield electrical interference between the first through fourth conduction loops.

According to example embodiments, a method of detecting defects in a semiconductor die including a central region in which a semiconductor integrated circuit is formed and a peripheral region surrounding the central region. The peripheral region includes a left-bottom corner region, a left-upper corner region, a right-upper corner region and a right-bottom corner region. A defect detection structure is also provided in the peripheral region. The defect detection structure includes a first conduction loop passing through the left-bottom corner region, a second conduction loop passing through the right-bottom corner region, a third conduction loop passing through the left-bottom corner region and the left-upper corner region, a fourth conduction loop passing through the right-bottom corner region and the right-upper corner region, and a shielding loop to at least partially shield electric interference between the first through fourth conduction loops. The method includes applying a test input signal to an input end node of the defect detection structure, receiving first through fourth test output signals from first through fourth output end nodes of the first through fourth conduction loops, and determining existence of defects in the semiconductor die and locations of the defects based on the test input signal and the first through fourth test output signals.

The defect detection structure, the semiconductor device and the associated method according to example embodiments may detect crack penetration of various types accurately using the plurality of conduction loops and the shielding loop formed in the peripheral region surrounding the central region in which the semiconductor integrated circuit is formed. The defect detection structure, the semiconductor device and the associated method according to example embodiments may increase the detectability of cracks and some other defects within semiconductor devices.

BRIEF DESCRIPTION OF THE DRAWINGS

Example embodiments of the present disclosure will be more clearly understood from the following detailed description taken in conjunction with the accompanying drawings.

FIGS. 2A, 2B and 2C are diagrams illustrating conduction loops included in a defect detection structure according to example embodiments.

FIGS. 5A, 5B, 5C and 5D are top views illustrating layouts of conduction layers of the defect detection structure of FIG. 4.

FIGS. 8A and 8B are perspective views illustrating a defect detection structure according to example embodiments.

FIGS. 9A, 9B, 9C and 9D are cross-sectional views illustrating a vertical structure of a defect detection structure according to example embodiments.

DETAILED DESCRIPTION OF THE EMBODIMENTS

Figure 1:
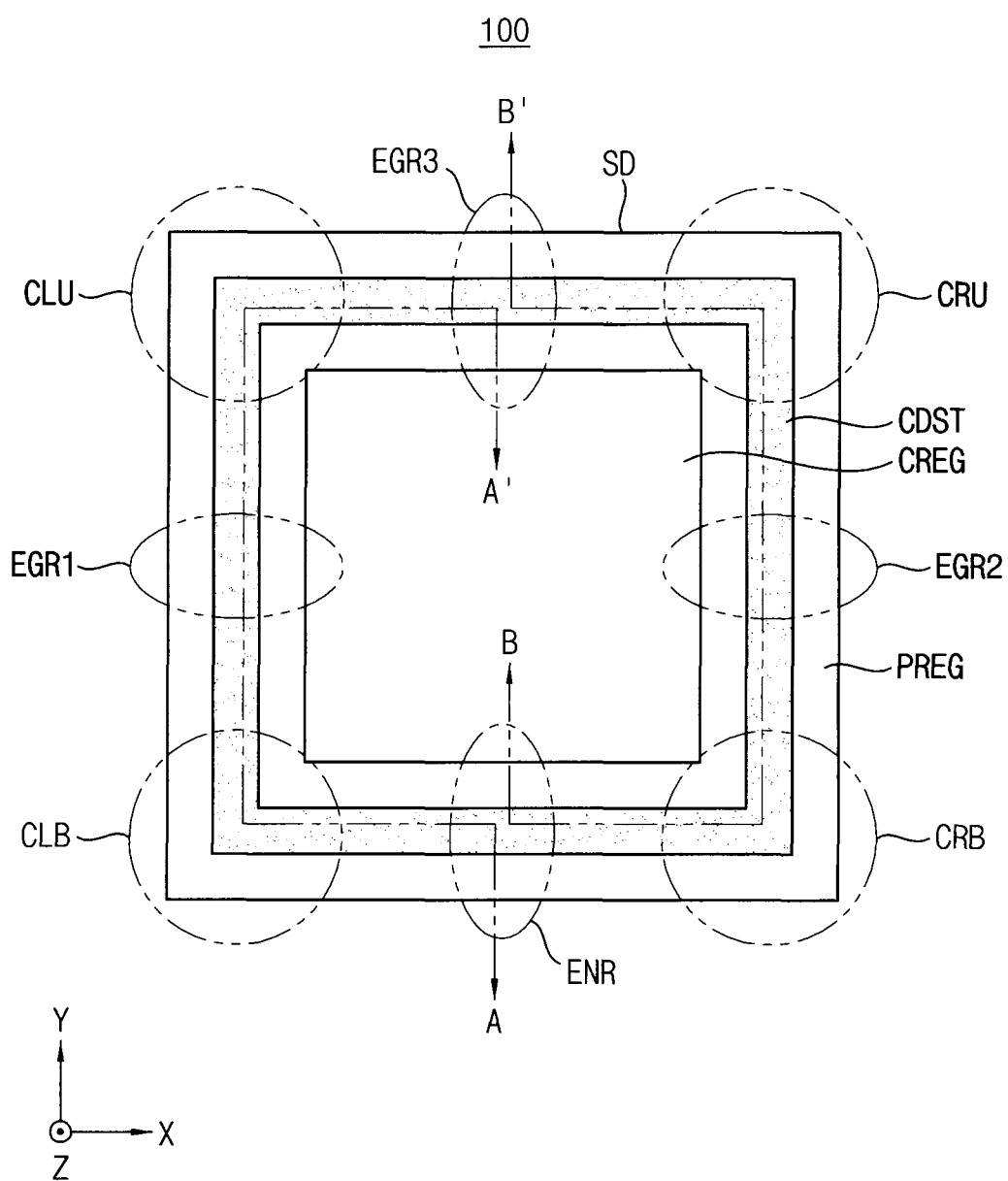
FIG. 1 is a top view illustrating a layout of a semiconductor device according to example embodiments.

Various example embodiments will be described more fully hereinafter with reference to the accompanying drawings, in which some example embodiments are shown. In the drawings, like numerals refer to like elements throughout. The repeated descriptions may be omitted.

FIG. 1 is a top view illustrating a layout of a semiconductor device according to example embodiments. Referring to FIG. 1, a semiconductor device 100 includes at least one semiconductor die SD. The semiconductor die SD includes a central region CREG and a peripheral region PREG surrounding the central region CREG. Various semiconductor integrated circuits may be formed in the central region CREG depending on a kind or type of the semiconductor device 100. For example, the semiconductor device 100 may be semiconductor memory device and/or a memory integrated circuit illustrated as FIGS. 25 and 26, and may be formed in the central region CREG of the semiconductor die SD.

A defect detection structure CDST according to example embodiments for detecting defects such as cracks may be formed in the peripheral region PREG. The defect detection structure CDST may be formed in a plurality of conduction layers disposed in a vertical direction Z that is perpendicular to a row direction and a column direction, and may be formed in a ring-shaped three-dimensional structure in the peripheral region PREG to surround the central region CREG.

Figure 7A:
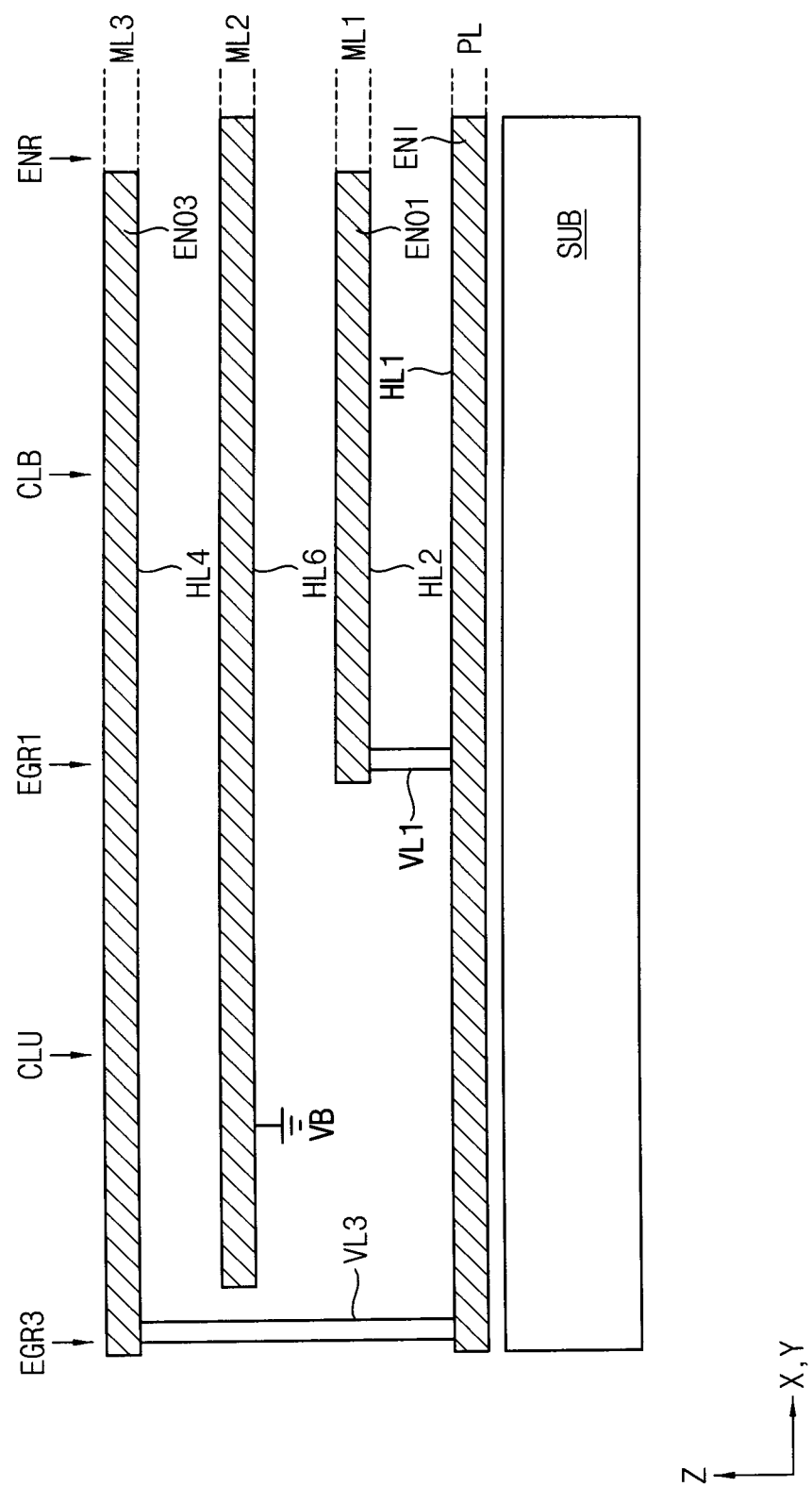
FIGS. 7A and 7B are cross-sectional views illustrating a semiconductor device including the defect detection structure of FIG. 4 according to example embodiments.
Figure 7B:
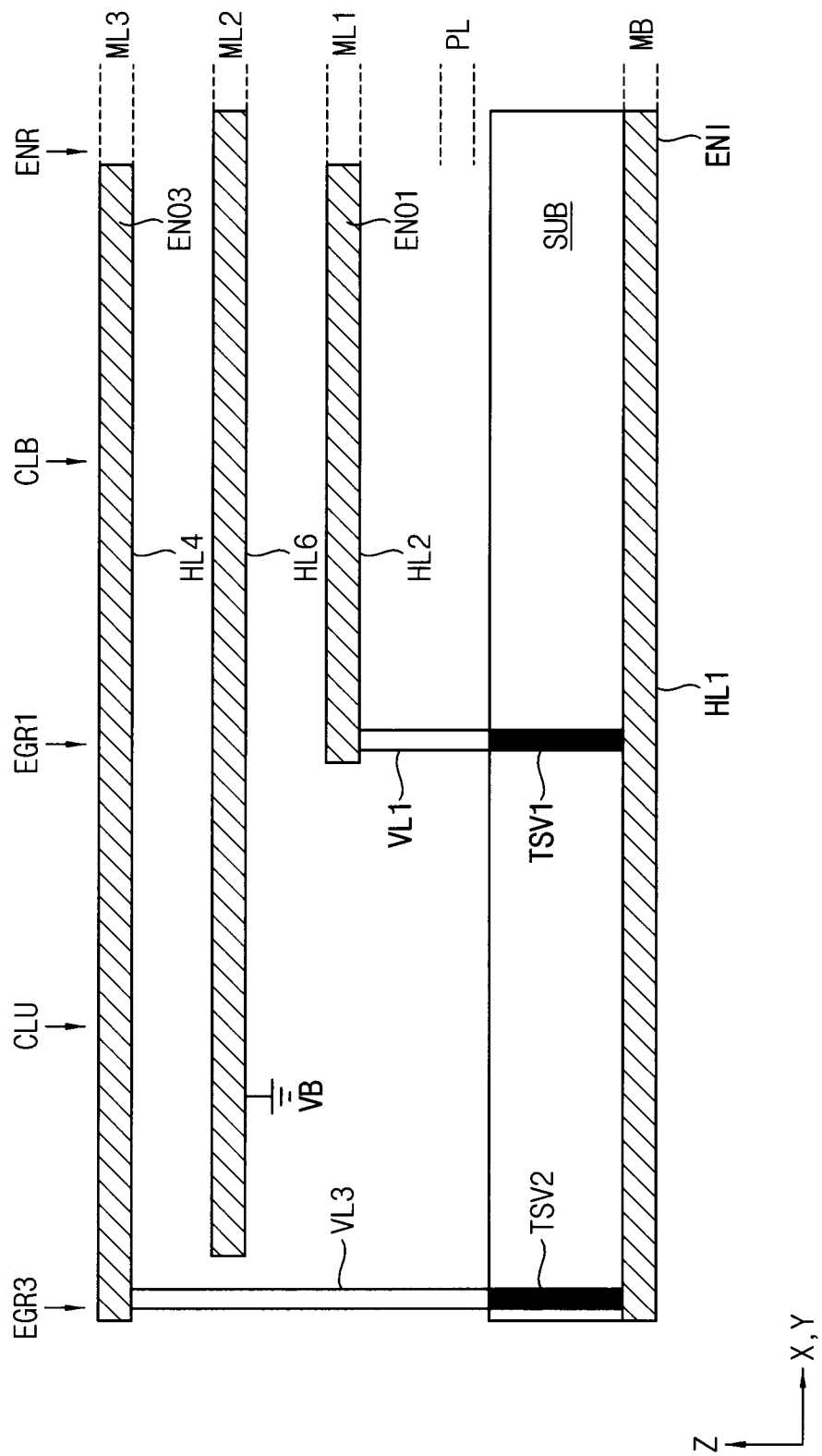

In some example embodiments, the semiconductor device 100 may include a single semiconductor die. In this case, the defect detection structure CDST may be formed using conduction layers within the single semiconductor die as illustrated in FIGS. 7A and 7B. In some other example embodiments, the semiconductor device 100 may include a plurality of semiconductor dies. In this case, the defect detection structure CDST may be formed using conduction layers distributed in the plurality of the semiconductor dies.

As will be described below, the defect detection structure CDST may include a first conduction loop, a second conduction loop, a third conduction loop, a fourth conduction loop and a shielding loop. The first conduction loop passes through a left-bottom corner region CLB of the peripheral region PREG. The second conduction loop passes through a right-bottom corner region CRB of the peripheral region PREG. The third conduction loop passes through the left-bottom corner region CLB and a left-upper corner region CLU of the peripheral region PREG. The fourth conduction loop passes through the right-bottom corner region CRB and a right-upper corner region CRU of the peripheral region PREG.

The shielding loop may shield electrical interference between the first through fourth conduction loops. The electrical interference indicates a phenomenon that a voltage or signal on one conduction line influences a voltage or signal on another conduction line due to parasitic capacitance and/or parasitic inductance between the conduction lines. The electrical interference may include effects due to capacitive coupling and/or inductive coupling between conduction lines.

The defect detection structure CDST and the semiconductor device 100 including the defect detection structure CDST according to example embodiments may accurately detect crack penetration of various types using the plurality of conduction loops and the shielding loop formed in the peripheral region PREG surrounding the central region CREG in which the semiconductor integrated circuit is formed.

Hereinafter, example embodiments are described using an orthogonal set of an X-axis, a Y-axis and a Z-axis for convenience of illustration and description. The X-axis, the Y-axis and the Z-axis are used to three perpendicular directions along the three directions, and are not limited to particular directions. The X direction corresponds to a first horizontal direction or a row direction, the Y direction corresponds to a second horizontal direction or a column direction and the Z direction corresponds to a vertical direction. If exceptional descriptions are not mentioned, the Z direction indicates a vertical direction perpendicular to conduction layers.

A portion of the peripheral region PREG between the left-bottom corner region CLB and the right-bottom corner region CRB may be referred to as an end node region ENR. A portion of the peripheral region PREG between the left-bottom corner region CLB and the left-upper corner region CLU may be referred to as a first edge region ERG1, a portion of the peripheral region PREG between the right-bottom corner region CRB and the right-upper corner region CRU may be referred to as a second edge region ERG2, and a portion of the peripheral region PREG between the left-upper corner region CLU and the right-upper corner region CRU may be referred to as a third edge region ERG3.

In this disclosure, "upper", "bottom", "left" and "right" are used not to represent particular fixed positions but to represent relative positions. Accordingly, example embodiments may include structures of bilateral symmetry, structures of top and bottom symmetry, rotated structures and the like with respect to the defect detection structure CDST disclosed herein.

Figure 2A:
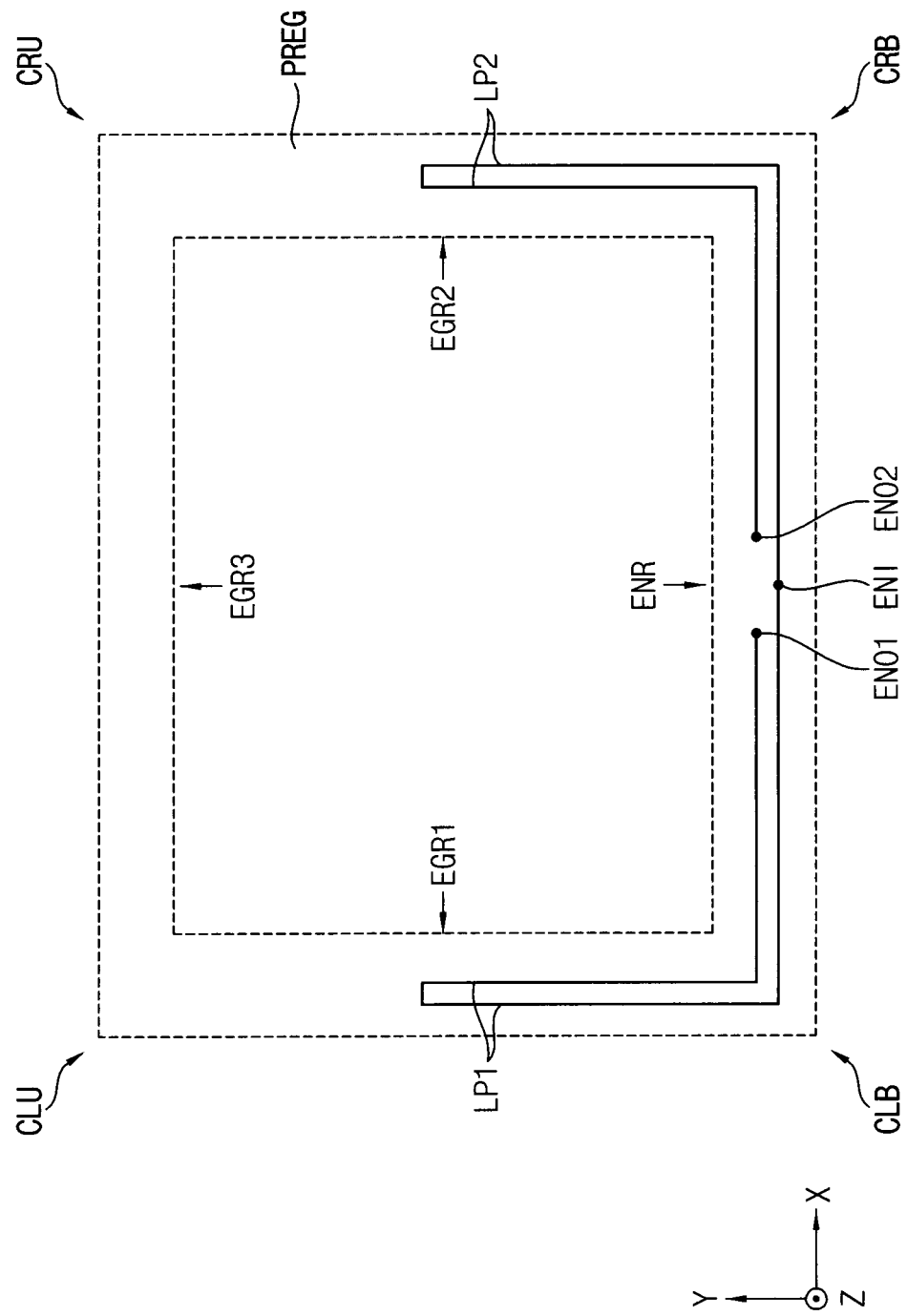
Figure 2C:
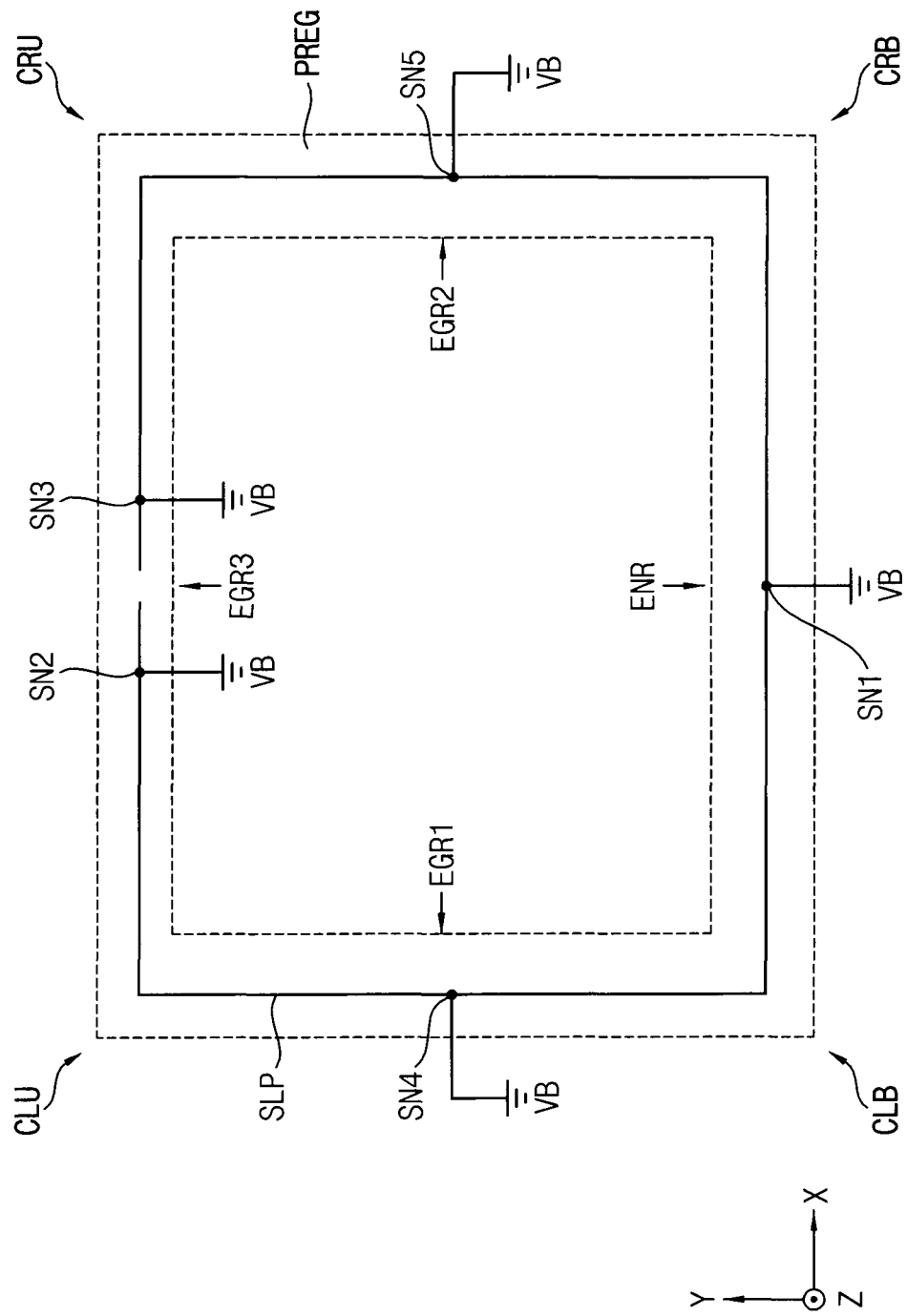

FIGS. 2A, 2B and 2C are diagrams illustrating conduction loops included in a defect detection structure according to example embodiments. FIG. 2A illustrates a first conduction loop LP1 and a second conduction loop LP2 and FIG. 2B illustrates a third conduction loop LP3 and a fourth conduction loop LP4. FIG. 2C illustrates a shielding loop SLP.

Referring to FIG. 2A, the first conduction loop LP1 passes through the left-bottom corner region CLB and the second conduction loop LP2 passes through the right-bottom corner region CRB. The first conduction loop LP1 extends along the peripheral region PREG from an input end node ENI located in an end node region ENR between the left-bottom corner region CLB and the right-bottom corner region CRB to the first edge region ERG1 between the left-bottom corner region CLB and the left-upper corner region CLU by passing through the left-bottom corner region CLB and returns from the first edge region ERG1 to a first output end node ENO1 located in the end node region ENR. In contrast, the second conduction loop LP2 extends along the peripheral region PREG from the input end node ENI to the second edge region ERG2 between the right-bottom corner region CRB and the right-upper corner region CRU by passing through the right-bottom corner region CRB and returns from the second edge region ERG2 to a second output end node ENO2 located in the end node region ENR.

Referring to FIG. 2B, the third conduction loop LP3 passes through the left-bottom corner region CLB and the left-upper corner region CLU and the fourth conduction loop LP4 passes through the right-bottom corner region CRB and the right-upper corner region CRU. This third conduction loop LP3 extends along the peripheral region PREG from the input end node ENI to the third edge region ERG3 between the left-upper corner region CLU and the right-upper corner region CRU by passing through the left-bottom corner region CLB and the left-upper corner region CLU and returns from the third edge region ERG3 to a third output end node ENO3 located in the end node region ENR. In contrast, the fourth conduction loop LP4 extends along the peripheral region PREG from the input end node ENI to the third edge region ERG3 by passing through the right-bottom corner region CRB and the right-upper corner region CRU and returns from the third edge region ERG3 to a fourth output end node ENO4 located in the end node region ENR. As a result, some or all of the end nodes of the first through fourth conduction loops LP1~LP4, that is, some or all of the input end node ENI and the first through fourth output end nodes ENO1~ENO4 may be located in the end node region ENR. Furthermore, the first through fourth conduction loops LP1~LP4 may be electrically connected by the common input end node ENI.

Figure 24:
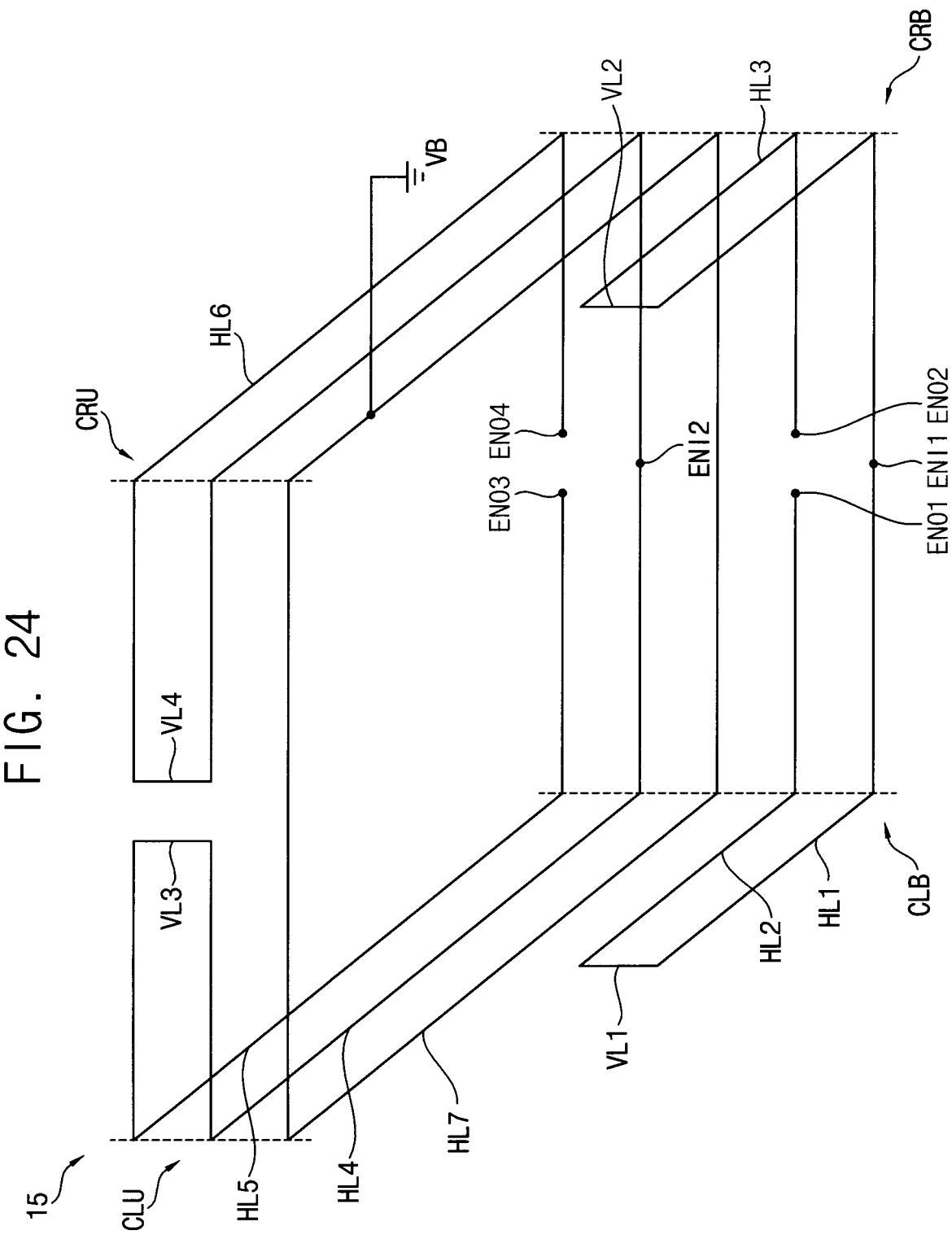

Referring to FIG. 2C, the shielding loop SLP of a ring shape may extend along the peripheral region PREG by passing through the left-bottom corner region CLB, the left-upper corner region CLU, the right-bottom corner region CRB and the right-upper corner region CRU. In some example embodiments, as illustrated in FIG. 2C, the shielding loop SLP may segmented/cut in the third edge region ERG3 so that the shielding loop SLP operates as an open loop. In some example embodiments, the shielding loop SLP may be cut into a plurality of loop segments that are electrically disconnected. In some example embodiments, as illustrated in FIG. 24, the shielding loop SLP may be a closed loop.

A constant bias voltage VB may be applied to the shielding loop SLP during a test operation to detect defects of the semiconductor device. The bias voltage VB may be a ground voltage, as shown, but example embodiments are not limited thereto.

In some example embodiments, as illustrated in FIG. 2C, the bias voltage VB may be applied through a plurality of bias nodes SN1~SN5 on the shielding loop SLP. When the shielding loop SLP includes a plurality of loop segments that are electrically disconnected, each loop segment may include at least one bias node to which the bias voltage VB is applied. The number and positions of the bias nodes may be determined considering the expected positions of various cracks, the ohmic drop of the shielding loop SLP, etc.

Figure 3:
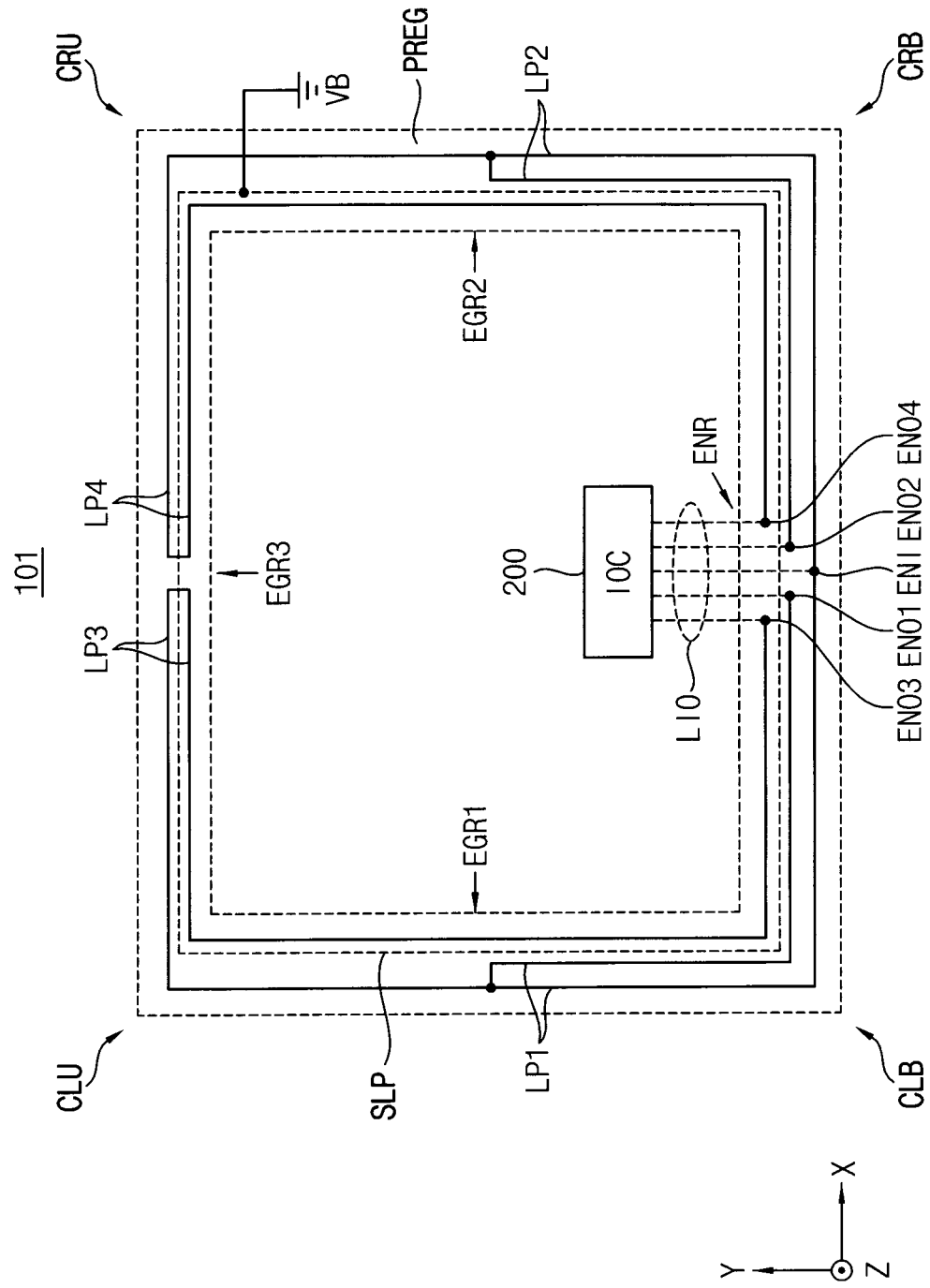
FIG. 3 is a diagram illustrating a semiconductor device according to example embodiments.

FIG. 3 is a diagram illustrating a semiconductor device according to example embodiments. Referring to FIG. 3, a semiconductor device 101 may include a defect detection structure having a ring shape formed in the peripheral region PREG of the semiconductor die and an input-output circuit IOC 200. The defect detection structure may include a first conduction loop LP1, a second conduction loop LP2, a third conduction loop LP3, a fourth conduction loop LP4 and a shielding loop SLP. The first conduction loop LP1 passes through the left-bottom corner region CLB, the second conduction loop LP2 passes through the right-bottom corner region CRB, the third conduction loop LP3 passes through the left-bottom corner region CLB and the left-upper corner region CLU, and the fourth conduction loop LP4 passes through the right-bottom corner region CRB and the right-upper corner region CRU. The shielding loop SLP shields the electrical interference between the first through fourth conduction loops LP1~LP4.

The end nodes ENI and ENO1~ENO4 of the first through fourth conduction loops LP1~LP4 may be electrically connected to the input-output circuit 200 via input-output lead lines LIO. The input-output lead lines LIO may be formed in various locations depending on the locations of the input-output circuit 200 and the end nodes ENI and ENO1~ENO4. Example embodiments of the input-output circuit 200 will be described below with reference to FIGS. 16 and 18.

As illustrated in FIG. 3, a horizontal line of the first conduction loop LP1 extending from the input end node ENI to the first edge region ERG1 may overlap with a portion of a horizontal line of the third conduction loop LP3 extending from the input end node ENI to the third edge region ERG3, and a horizontal line of the second conduction loop LP2 extending from the input end node ENI to the second edge region ERG2 may overlap with a portion of a horizontal line of the fourth conduction loop LP4 extending from the input end node ENI to the third edge region ERG3.

For convenience of illustration, the shielding loop SLP is represented by a dotted line in FIG. 3. As will be described below, a first portion of the shielding loop SLP may be disposed at a position to shield the electrical interference between a horizontal line of the first conduction loop LP1 and a horizontal line of the third conduction loop LP3, and a second portion of the shielding loop SLP may be disposed at a position to shield the electrical interference between a horizontal line of the second conduction loop LP2 and a horizontal line of the fourth conduction loop LP4.

Figure 4:
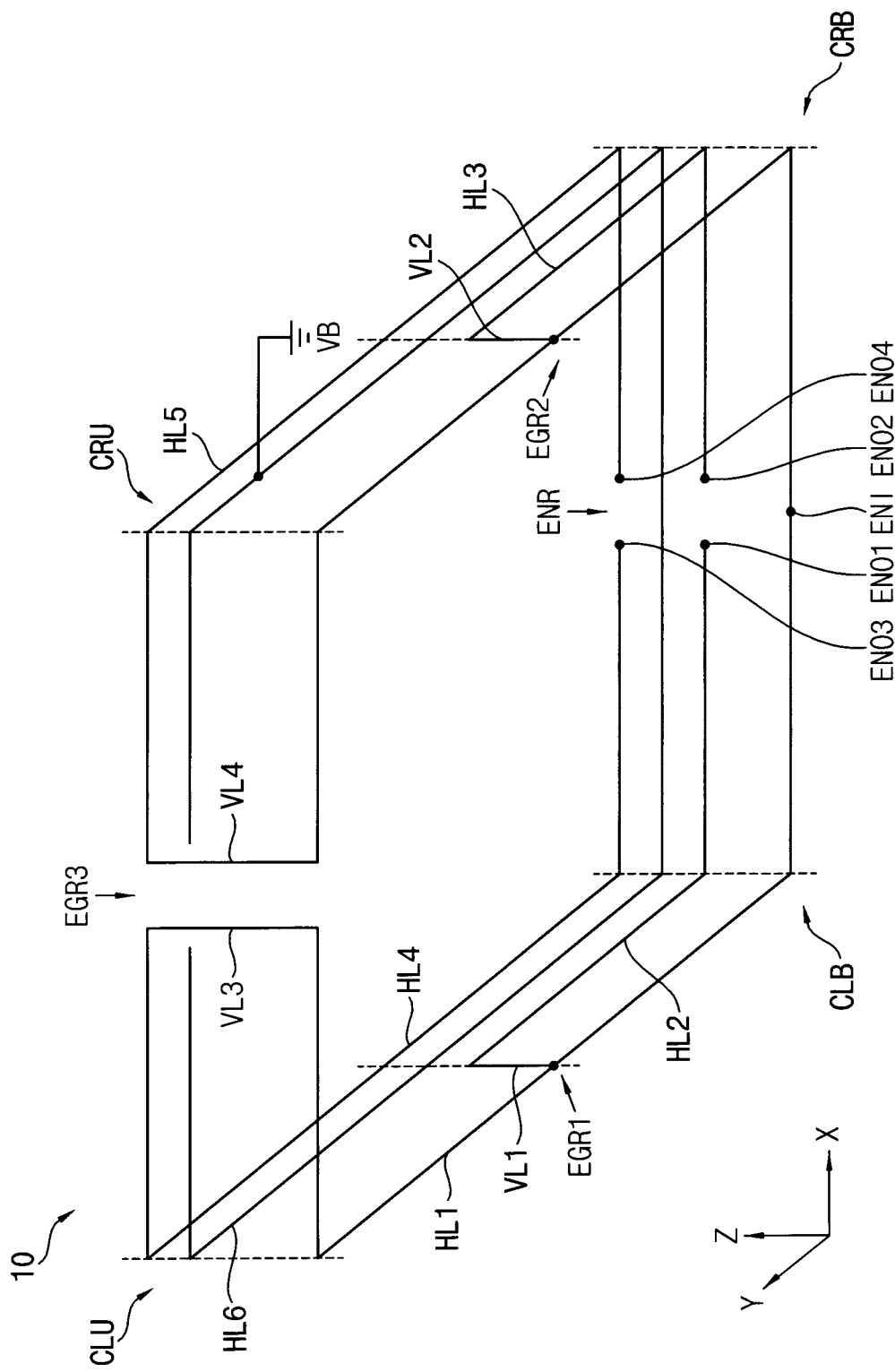
FIG. 4 is a perspective view illustrating a defect detection structure according to example embodiments.

Hereinafter, example embodiments of the defect detection structure included in the semiconductor device 101 of FIG. 3 will be described below with reference to FIGS. 4 through 9D. In particular, FIG. 4 is a perspective view illustrating a defect detection structure according to example embodiments, whereas FIGS. 5A, 5B, 5C and 5D are top views illustrating layouts of conduction layers of the defect detection structure of FIG. 4, and FIGS. 6A and 6B are cross-sectional views illustrating a vertical structure of the defect detection structure of FIG. 4.

Figure 5A:
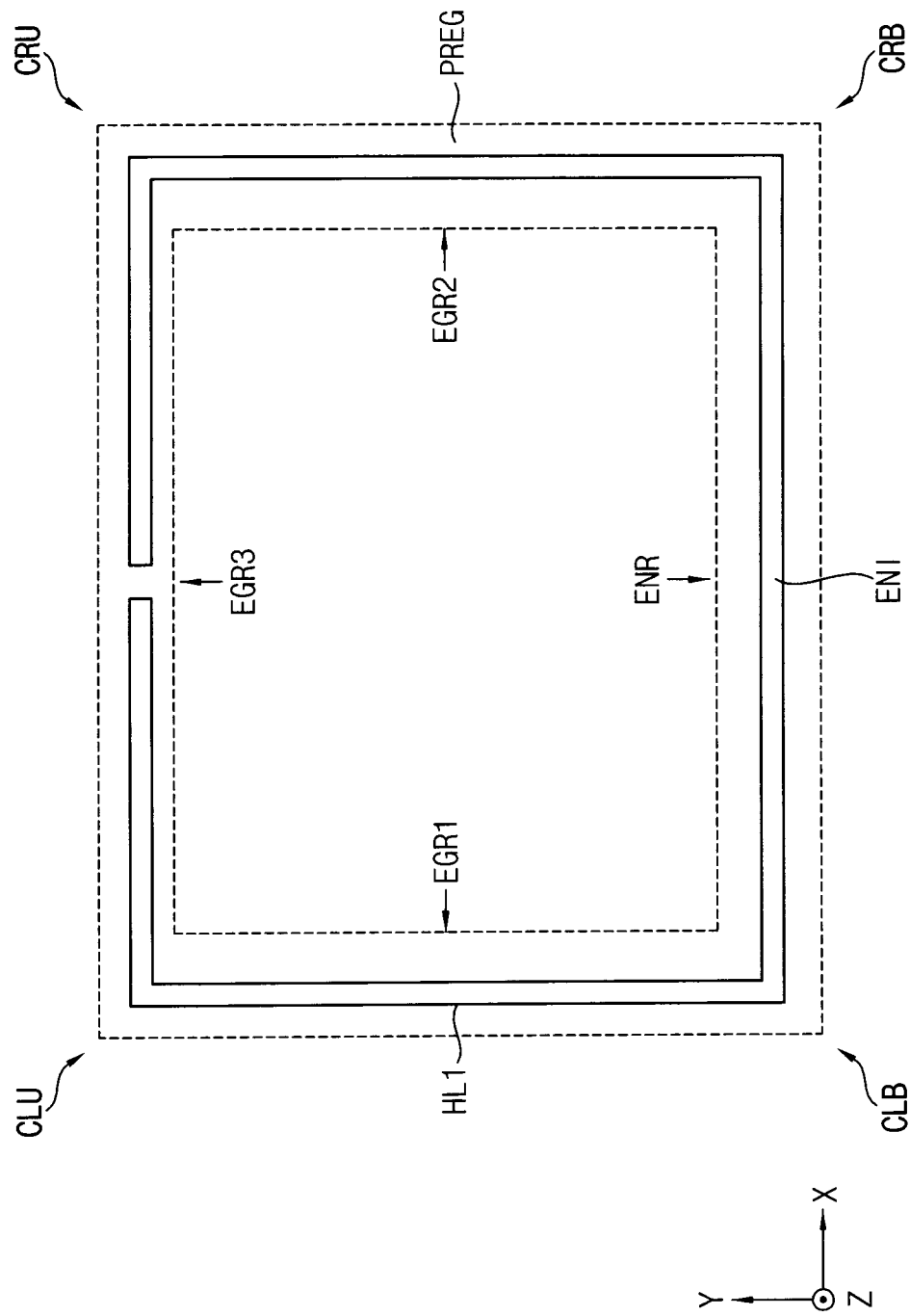
Figure 5B:
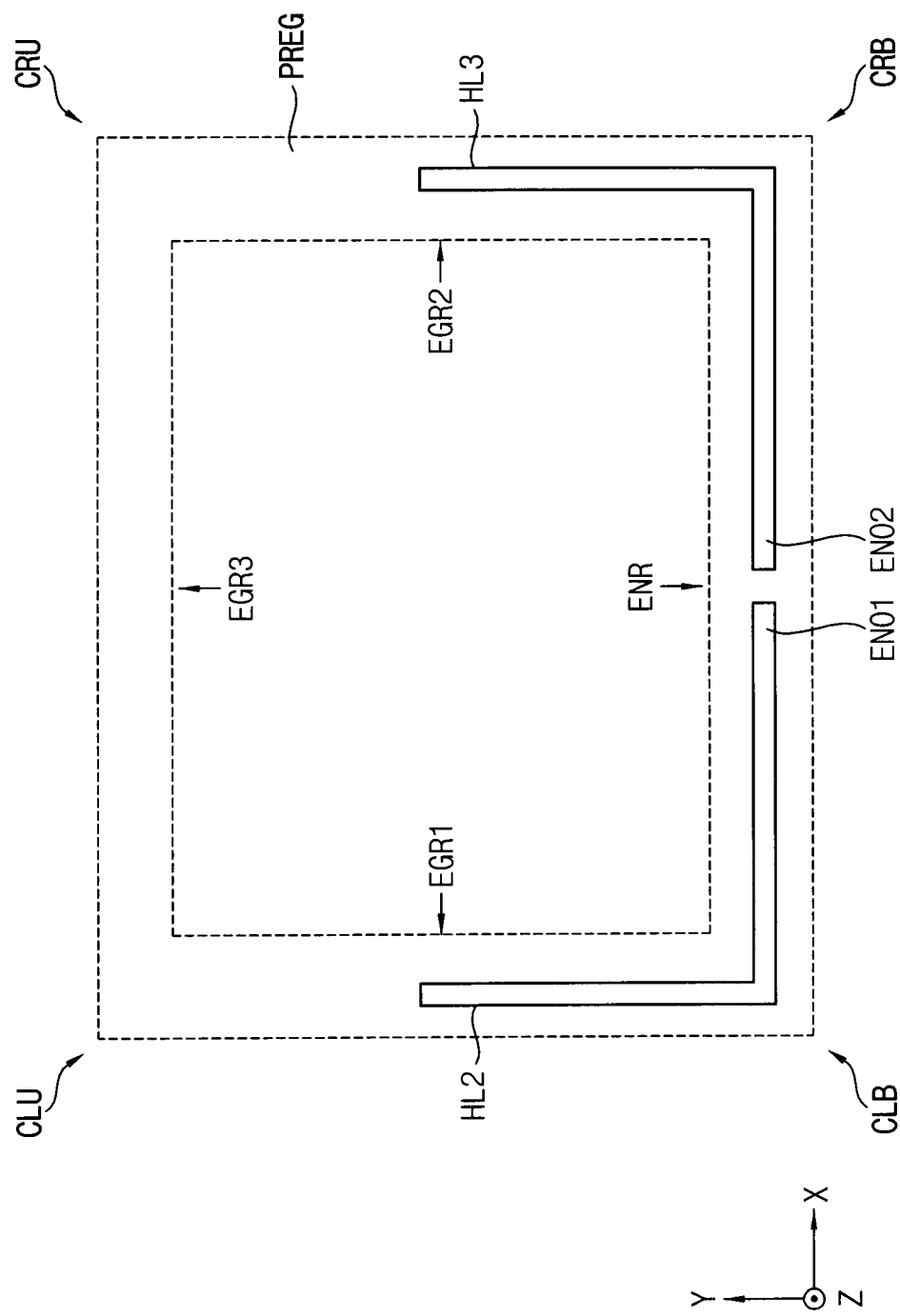
Figure 6A:
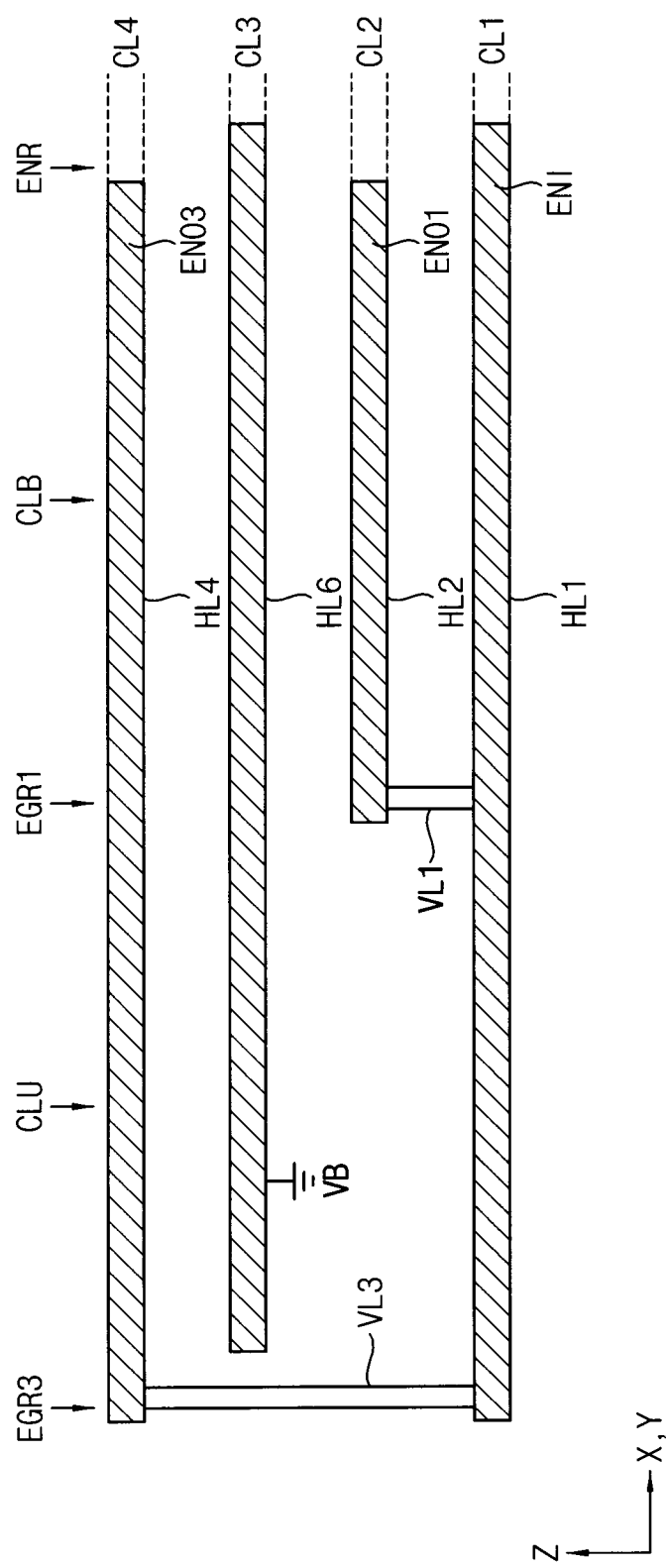
FIGS. 6A and 6B are cross-sectional views illustrating a vertical structure of the defect detection structure of FIG. 4.
Figure 6B:
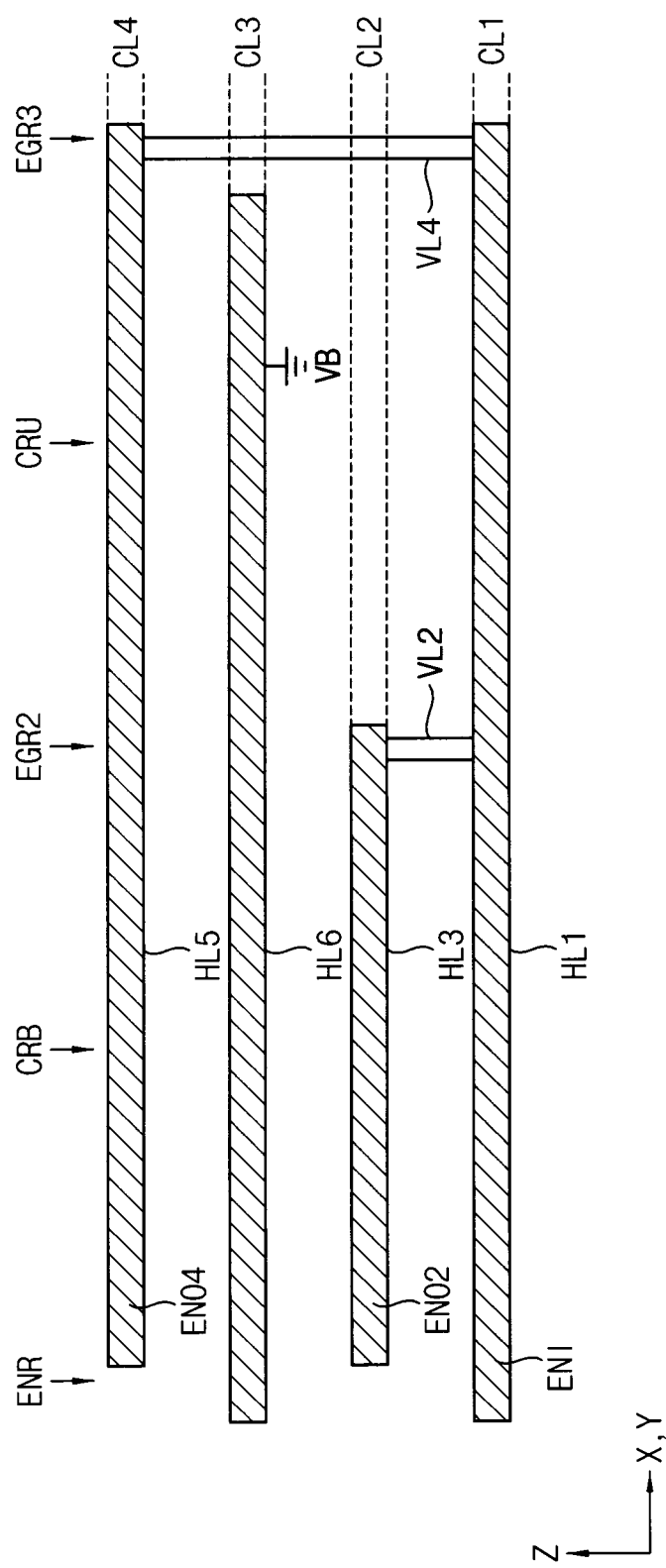

FIG. 5A illustrates a layout of a first conduction layer CL1, FIG. 5B illustrates a layout of a second conduction layer CL2, FIG. 5C illustrates a layout of a fourth conduction layer CL4, and FIG. 5D illustrates a layout of a third conduction layer CL3. FIG. 6A illustrates a cross-sectional view along the line A-A' in FIG. 1 and FIG. 6B illustrates a cross-sectional view along the line B-B' in FIG. 1.

Referring to FIGS. 4 through 6B, a defect detection structure 10 may include a first horizontal line HL1, a second horizontal line HL2, a third horizontal line HL3, a fourth horizontal line HL4, a fifth horizontal line HL5, a sixth horizontal line HL6, a first vertical line VL1, a second vertical line VL2, a third vertical line VL3 and/or a fourth vertical line VL4.

The first horizontal line HL1 is formed in the first conduction layer CL1. The first horizontal line HL1 of a ring shape extends along the peripheral region PREG by passing through the left-bottom corner region CLB, the left-upper corner region CLU, the right-upper corner region CRU and the right-bottom corner region CRB. The first horizontal line HL1 is cut in the third edge region ERG3 between the left-upper corner region CLU and the right-upper corner region CRU. Similarly, the second horizontal line HL2 is formed in the second conduction layer CL2. The second horizontal line HL2 extends from a first output end node ENO1 located in the end node region ENR between the left-bottom corner region CLB and the right-bottom corner region CRB to the first edge region ERG1 between the left-bottom corner region CLB and the left-upper corner region CLU by passing through the left-bottom corner region CLB. In addition, the third horizontal line HL3 is also formed in the second conduction layer CL2. The third horizontal line HL3 extends from a second output end node ENO2 located in the end node region ENR to the second edge region ERG2 between the right-bottom corner region CRB and the right-upper corner region CRU by passing through the right-bottom corner region CRB.

The fourth horizontal line HL4 is formed in the fourth conduction layer CL4. The fourth horizontal line HL4 extends from a third output end node ENO3 located in the end node region ENR to the third edge region ERG3 by passing through the left-bottom corner region CLB and the left-upper corner region CLU. The fifth horizontal line HL5 is also formed in the fourth conduction layer CL4. The fifth horizontal line HL5 extends from a fourth output end node ENO4 located in the end node region ENR to the third edge region ERG3 by passing through the right-bottom corner region CRB and the right-upper corner region CRU. Finally, the sixth horizontal line HL6 is formed in the third conduction layer CL3. The sixth horizontal line HL6 of a ring shape extends along the peripheral region PREG by passing through the left-bottom corner region CLB, the left-upper corner region CLU, the right-upper corner region CRU and the right-bottom corner region CRB. The sixth horizontal line HL6 is in the third edge region ERG3.

The first vertical line VL1 connects the first horizontal line HL1 and the second horizontal line HL2 in the first edge region ERG1, and the second vertical line VL2 connects the first horizontal line HL1 and the third horizontal line HL3 in the second edge region ERG2. The third vertical line VL3 connects the first horizontal line HL1 and the fourth horizontal line HL4 in the third edge region ERG3, and the fourth vertical line VL4 connects the first horizontal line HL1 and the fifth horizontal line HL5 in the third edge region ERG3.

The first conduction loop LP1 in FIG. 3 includes a portion of the first horizontal line HL1, the first vertical line VL1 and the second horizontal line HL2. The second conduction loop LP2 in FIG. 3 includes a portion of the first horizontal line HL1, the second vertical line VL2 and the third horizontal line HL3. The third conduction loop LP3 in FIG. 3 includes a portion of the first horizontal line HL1, the third vertical line VL3 and the fourth horizontal line HL4. The fourth conduction loop LP4 in FIG. 3 includes a portion of the first horizontal line HL1, the fourth vertical line VL4 and the fifth horizontal line HL5. The shielding loop SLP in FIG. 3 includes the sixth horizontal line HL6. The constant bias voltage VB may be applied to the shielding loop SLP during a test operation to detect defects of the semiconductor device.

As such, the first conduction loop LP1 and the second conduction loop LP2 may be formed using the first conduction layer CL1 and the second conduction layer CL2, the shielding loop SLP may be formed using the third conduction layer CL3 and the third conduction loop LP3 and the fourth conduction loop LP4 may be formed using the first conduction layer CL1 and the fourth conduction layer CL4.

A first portion of the shielding loop SLP may be disposed at a position to shield the electrical interference between the horizontal line of the first conduction loop LP1 and the horizontal line of the third conduction loop LP3. As illustrated in FIGS. 4 and 6A, a left half portion of the sixth horizontal line HL6 corresponding the shielding loop SLP may be disposed to be overlapped with the second horizontal line HL2 and the fourth horizontal line HL4 in the vertical direction Z.

A second portion of the shielding loop SLP may be disposed at a position to shield the electrical interference between the horizontal line of the second conduction loop LP2 and the horizontal line of the fourth conduction loop LP4. As illustrated in FIGS. 4 and 6B, a right half portion of the sixth horizontal line HL6 corresponding the shielding loop SLP may be disposed to be overlapped with the third horizontal line HL3 and the fifth horizontal line HL5 in the vertical direction Z.

FIGS. 7A and 7B are cross-sectional views illustrating a semiconductor device including the defect detection structure of FIG. 4 according to example embodiments. FIGS. 7A and 7B illustrate cross-sectional views along the line A-A' in FIG. 1. Even though not illustrated, the cross-sectional views along the line B-B' in FIG. 1 have bilateral symmetry with respect to those of FIGS. 7A and 7B, respectively. The repeated descriptions with FIGS. 1 through 6B are omitted.

Referring to FIG. 7A, a defect detection structure may be formed using conduction layers above an underlying semiconductor substrate SUB (having active circuitry embedded therein). The above-described first conduction layer CL1 may correspond to a polysilicon layer PL, the above-described second conduction layer CL2 may correspond to a first metal layer ML1 above the polysilicon layer PL, the above-described third conduction layer CL3 may correspond to a second metal layer ML2 above the first metal layer ML1, and the above-described fourth conduction layer CL4 may correspond to a third metal layer ML3 above the second metal layer ML2. FIG. 7A illustrates the one polysilicon layer PL and the three metal layers ML1, ML2 and ML3 for convenience of illustrations, but the semiconductor device may include two or more polysilicon layers and three or more metal layers.

The vertical lines VL1 and VL3 may include vertical contacts to electrically connect the horizontal lines HL1, HL2 and HL4 formed in the polysilicon layer PL, the first metal layer ML1 and the third metal layer ML3. In some example embodiments, intermediate conduction layers may exist between the polysilicon layer PL and the third metal layer ML3. In this case, each of the vertical lines VL1 and VL3 may include a plurality of vertical contacts. The constant bias voltage VB may be applied to the sixth horizontal line HL6 corresponding to the shielding loop SLP during the test operation to detect defects of the semiconductor device.

Referring to FIG. 7B, a defect detection structure may be formed using conduction layers above a semiconductor substrate SUB and a metal layer beneath a bottom surface of the semiconductor substrate SUB. The above-described first conduction layer CL1 may correspond to a bottom metal layer MB beneath the semiconductor substrate SUB, the above-described second conduction layer CL2 may correspond to a first metal layer ML1 above a polysilicon layer PL, the above-described third conduction layer CL3 may correspond to a second metal layer ML2 above the first metal layer ML1, and the above-described fourth conduction layer CL4 may correspond to a third metal layer ML3 above the second metal layer ML2.

The vertical lines VL1 and VL3 may include vertical contacts and through-silicon vias TSV1 and TSV2 penetrating the semiconductor substrate SUB to electrically connect the horizontal lines HL1, HL2 and HL4 formed in the bottom metal layer MB, the first metal layer ML1 and the third metal layer ML3. The constant bias voltage VB may be applied to the sixth horizontal line HL6 corresponding to the shielding loop SLP during the test operation to detect defects of the semiconductor device.

The two example embodiments of the defect detection structure using the conduction layers above and below the semiconductor substrate SUB are described with reference to FIGS. 7A and 7B. It would be easily understood that the defect detection structure according to example embodiments may be implemented using various combinations of conduction layers.

FIGS. 8A and 8B are perspective views illustrating a defect detection structure according to example embodiments. In a defect detection structure 11 of FIG. 8A and a defect detection structure 12 of FIG. 8B, the first through fourth conduction loops are the same as those as described with reference to FIGS. 4 through 6B. Thus, the repeated descriptions are omitted and only a structure of a shielding loop will be described.

Referring to FIG. 8A, the shielding loop SLP of the defect detection structure 11 may include a plurality of horizontal lines HLa and HLb, which are respectively formed in a plurality of conduction layers, and the horizontal lines HLa and HLb may be electrically connected. FIG. 8A illustrates the two horizontal lines HLa and HLb as an example. According to example embodiments, the shielding loop SLP may include three or more horizontal lines respectively formed in three or more conduction layers. The constant bias voltage VB may be applied to the shielding loop SLP through one or more bias nodes during the test operation.

Referring to FIG. 8B, the defect detection structure 12 may include a plurality of shielding loops disposed in respective positions. FIG. 9B illustrates two shielding loops, that is, a first shielding loop SLPc and a second shielding loop SLPd, as an example. According to example embodiments, the defect detection structure may three or more shielding loops. The first shielding loop SLPc may include a horizontal line HLc and the second shielding loop SLPd may include a horizontal line HLd. In some example embodiments, each of the first shielding loop SLPc and the second shielding loop SLPd may be implemented with a plurality of horizontal lines respectively formed in a plurality of conduction layers as described with reference to FIG. 8A. The constant bias voltage VB may be applied to each of the first shielding loop SLPc and the second shielding loop SLPd through one or more bias nodes during the test operation.

At least a portion of the shielding loop may be disposed at a position to shield the electrical interference between two horizontal lines respectively included in the first through fourth conduction loops. For example, as illustrated in FIG. 8B, the left half portion of the first shielding loop SLPc may be disposed between the two horizontal lines HL1 and HL2 of the first conduction loop LP1 as described with reference to FIGS. 4 through 6B, and the right half portion of the first shielding loop SLPc may be disposed between the two horizontal lines HL1 and HL3 of the second conduction loop LP2 as described with reference to FIGS. 4 through 6B.

FIGS. 9A, 9B, 9C and 9D are cross-sectional views illustrating a vertical structure of a defect detection structure according to example embodiments. FIGS. 9A through 9D illustrate a cross-sectional view along the line A-A' in FIG. 1. Even though not illustrated, a cross-sectional view along the line B-B' in FIG. 1 is symmetrical with the views of FIGS. 9A through 9D. The basic structure of FIGS. 9A through 9D are substantially the same as the structure of FIG. 6A, and the repeated descriptions are omitted.

Figure 9A:
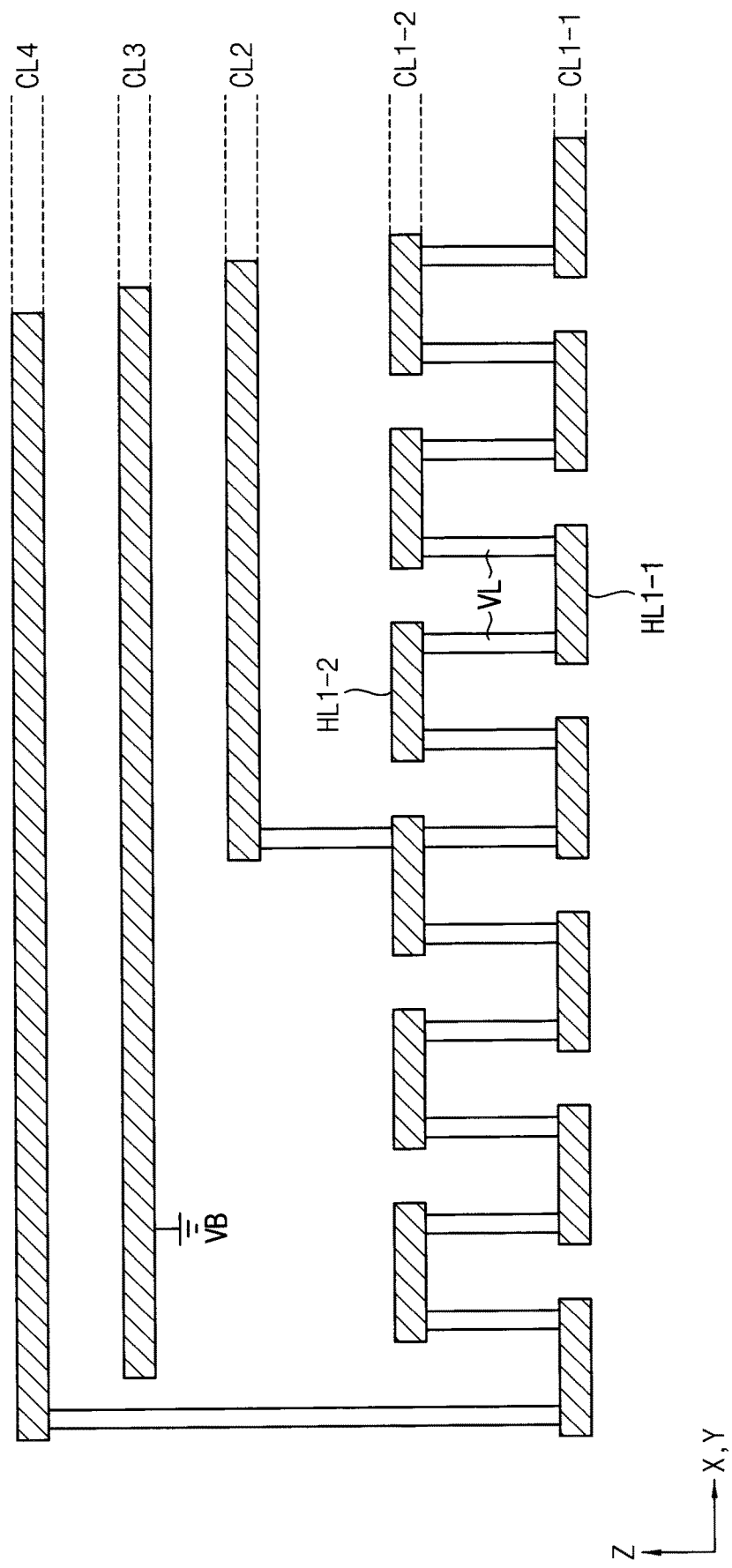
Figure 9B:
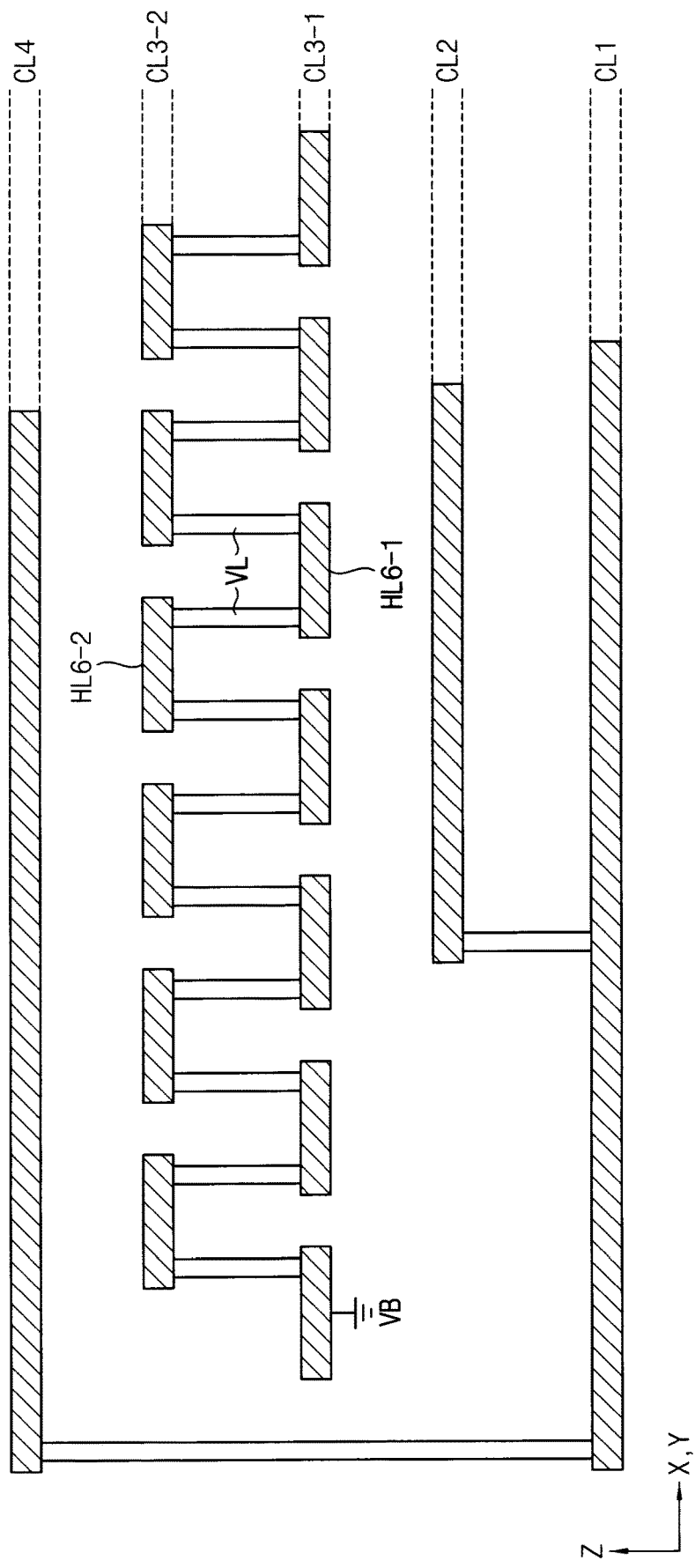

As shown in FIGS. 9A through 9D, a single horizontal line forming the conduction loop and/or the shielding loop may be extended in the vertical direction Z across two conduction layers. In some example embodiments, the first horizontal line HL1 formed in the first conduction layer CL1 in FIG. 6A may be extended in the vertical direction Z such as a structure across two conduction layers CL1-1 and CL1-2 as illustrated in FIG. 9A. The first horizontal line HL1 in FIG. 6A may include first lower horizontal lines HL1-1 formed in a first lower conduction layer CL1-1, first upper horizontal lines HL1-2 formed in a first upper conduction layer CL1-2, and vertical lines VL connecting the first lower horizontal lines HL1-1 and the first upper horizontal lines HL1-2.

In some example embodiments, the sixth horizontal line HL6 formed in the third conduction layer CL3 in FIG. 6A may be extended in the vertical direction Z such as a structure across two conduction layers CL3-1 and CL3-2 as illustrated in FIG. 9B. The sixth horizontal line HL6 in FIG.

6A may include sixth lower horizontal lines HL6-1 formed in a third lower conduction layer CL3-1, sixth upper horizontal lines HL3-2 formed in a third upper conduction layer CL3-2, and vertical lines VL connecting the sixth lower horizontal lines HL6-1 and the sixth upper horizontal lines HL6-2.

In some example embodiments, the fourth horizontal line HL4 formed in the fourth conduction layer CL4 in FIG. 6A may be extended in the vertical direction Z such as a structure across two conduction layers CL4-1 and CL4-2 as illustrated in FIG. 9C. The fourth horizontal line HL4 in FIG. 6A may include fourth lower horizontal lines HL4-1 formed in a fourth lower conduction layer CL4-1, fourth upper horizontal lines HL4-2 formed in a fourth upper conduction layer CL4-2, and vertical lines VL connecting the fourth lower horizontal lines HL4-1 and the fourth upper horizontal lines HL4-2.

Figure 9D:
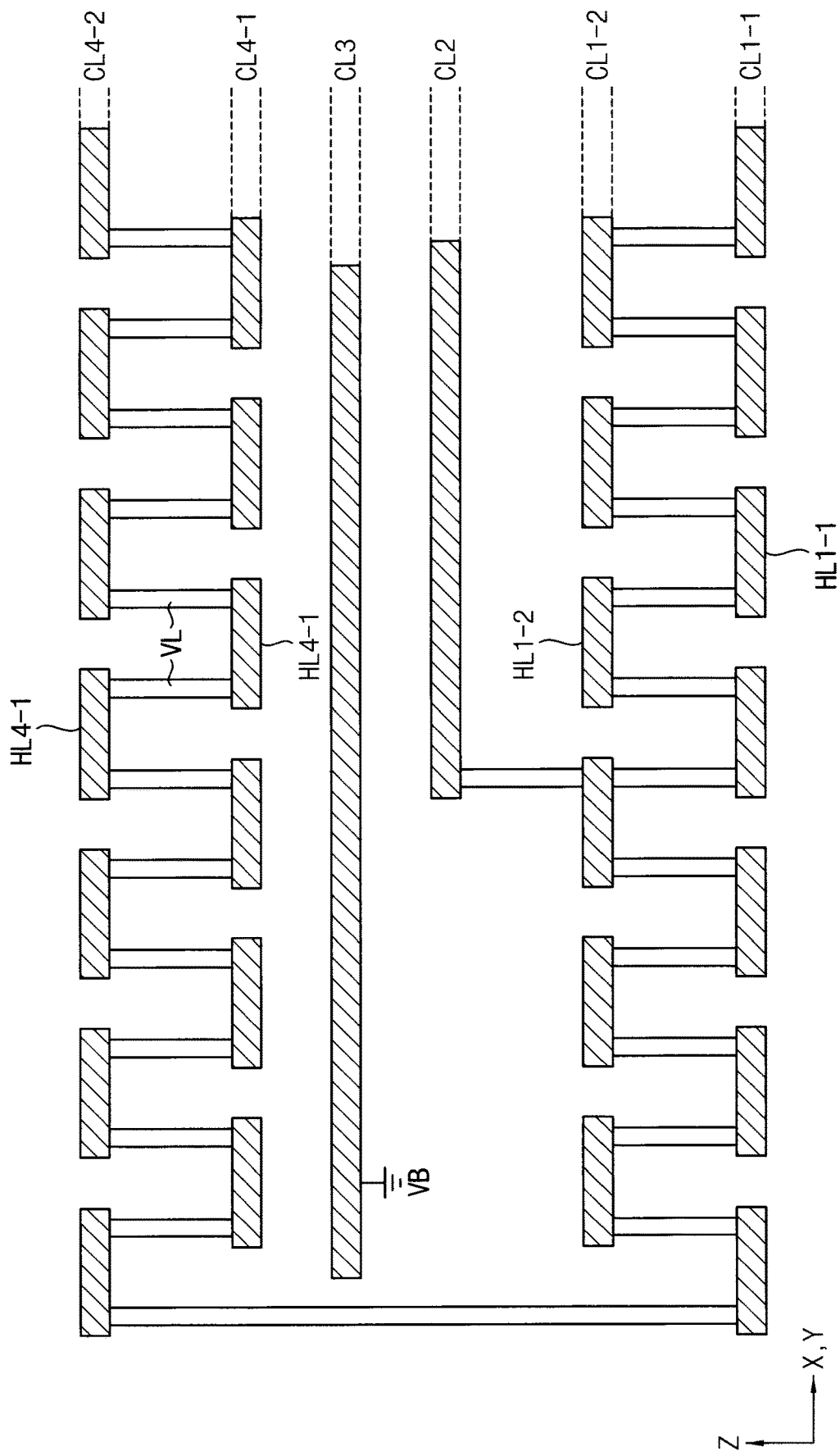

FIG. 9D illustrates an example embodiment corresponding to a combination of the example embodiments of FIGS. 9A and 9C. The first horizontal line HL1 formed in the first conduction layer CL1 in FIG. 6A may be extended in the vertical direction Z such as a structure across two conduction layers CL1-1 and CL1-2, and the fourth horizontal line HL4 formed in the fourth conduction layer CL4 in FIG. 6A may be extended in the vertical direction Z such as a structure across two conduction layers CL4-1 and CL4-2, as illustrated in FIG. 9D. The first horizontal line HL1 in FIG. 6A may include first lower horizontal lines HL1-1 formed in a first lower conduction layer CL1-1, first upper horizontal lines HL1-2 formed in a first upper conduction layer CL1-2, and vertical lines VL connecting the first lower horizontal lines HL1-1 and the first upper horizontal lines HL1-2. In addition, The fourth horizontal line HL4 in FIG. 6A may include fourth lower horizontal lines HL4-1 formed in a fourth lower conduction layer CL4-1, fourth upper horizontal lines HL4-2 formed in a fourth upper conduction layer CL4-2, and vertical lines VL connecting the fourth lower horizontal lines HL4-1 and the fourth upper horizontal lines HL4-2. Accordingly, the cracks may be detected more accurately by extending, in the vertical direction Z, at least one horizontal line forming the conduction loop and/or the shielding loop.

Figure 10A:
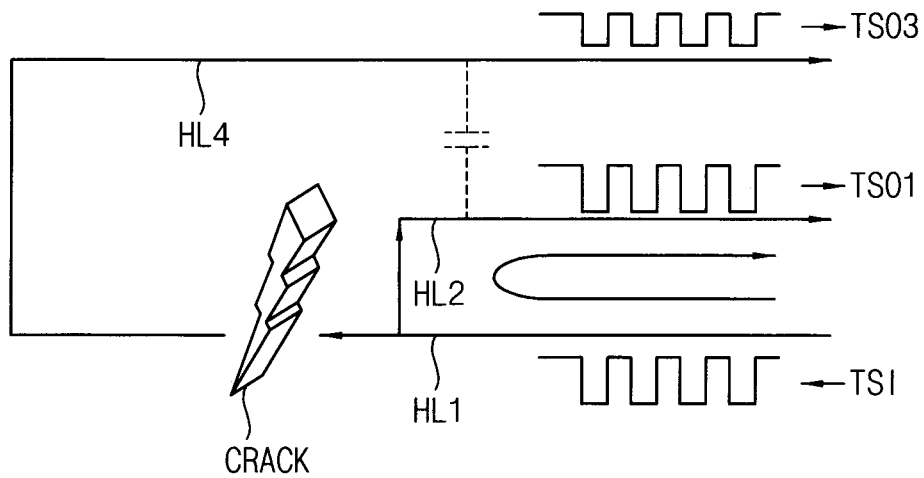
FIGS. 10A, 10B and 10C are diagrams illustrating an electrical noise shielding effect of a defect detection structure according to example embodiments.
Figure 10B:
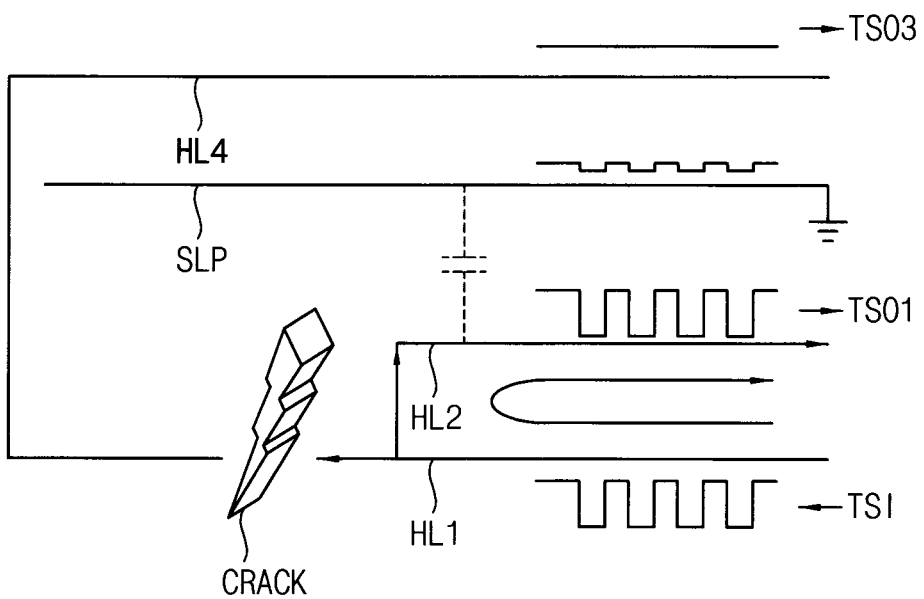
Figure 10C:
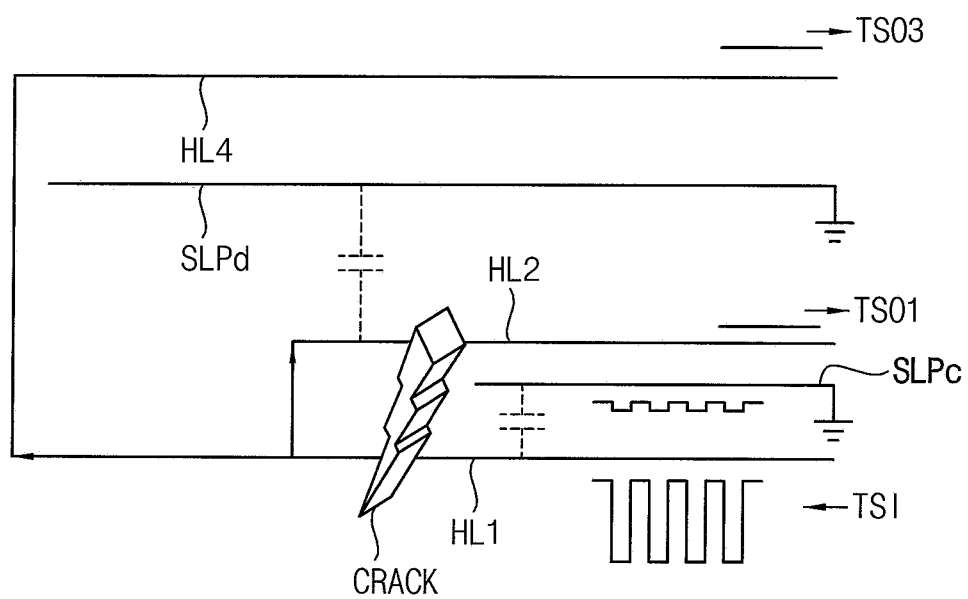

FIGS. 10A, 10B and 10C are diagrams illustrating noise shielding effect of a defect detection structure according to example embodiments. FIGS. 10A, 10B and 10C illustrate capacitors of dotted lines representing electrical interference between two conduction lines, and waveforms of a test input signal TSI and test output signals TSO1 and TSO3 of the conduction lines. The defect detection structure of FIGS. 10A, 10B and 10C is substantially the same as described with reference to FIGS. 4 through 9D.

Referring to FIGS. 10A and 10B, the first horizontal line HL1 may be cut/broken by a crack and thus the fourth horizontal line HL4 may be electrically floated. When the shielding loop is not included as illustrated in FIG. 10A, the first test output signal TSO1 on the second horizontal line HL2 may affect the fourth horizontal line HL4 in the floating state due to the electrical interference between the second horizontal line HL2 and the fourth horizontal line HL4. As a result, noises may be caused in the third test output signal TSO3 on the fourth horizontal line HL4.

As illustrated in FIG. 10B, a portion of the shielding loop SLP may be disposed at a position to shield the electrical interference between the second horizontal line HL2 of the first conduction loop and the fourth horizontal line HL4 of the third conduction loop. In this case, even though the electrical interference occurs between the second horizontal line HL2 and the shielding loop SLP, very weak noises of a ripple shape may be caused on the shielding loop SLP because the bias voltage is applied to the shielding loop SLP. The ripple noises on the shielding loop SLP may hardly affect the fourth horizontal line HL4, and the noises of the third test output signal TSO3 on the fourth horizontal line HL4 may be prevented or reduced.

Referring to FIG. 10C, the first horizontal line HL1 and the second horizontal line HL2 may be cut by a crack and thus the second horizontal line HL2 and the fourth horizontal line HL4 may be electrically floated. As illustrated in FIG. 10C, a portion of the shielding loop SLPc may be disposed at a position to shield the electrical interference between first horizontal line HL1 and the second horizontal line HL2, and a portion of the shielding loop SLPd may be disposed at a position to shield the electrical interference between the second horizontal loop HL2 and the fourth horizontal line HL4. In this case, even though the electrical interference occurs between the second horizontal line HL2 and the shielding loop SLPc, very weak noises of a ripple shape may be caused on the shielding loop SLPc because the bias voltage is applied to the shielding loop SLPc. The ripple noises on the shielding loop SLPc may hardly affect the fourth horizontal line HL2, and the noises of the first test output signal TSO1 on the second horizontal line HL2 may be prevented or reduced.

Figure 11:
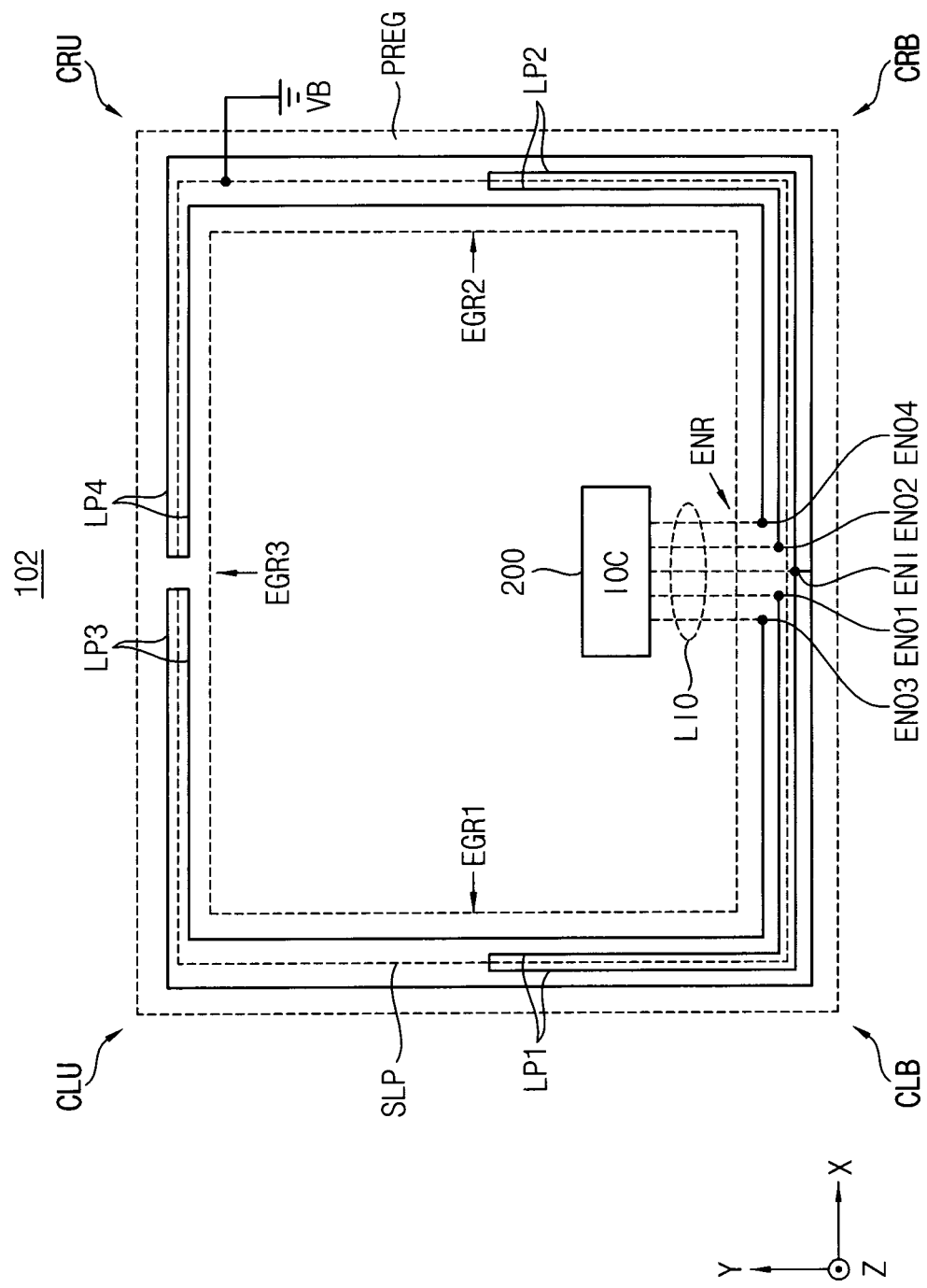
FIG. 11 is a diagram illustrating a semiconductor device according to example embodiments.

FIG. 11 is a diagram illustrating a semiconductor device according to example embodiments. Referring to FIG. 11, a semiconductor device 102 may include a defect detection structure having a ring shape formed in the peripheral region PREG of the semiconductor die and an input-output circuit IOC 200. The defect detection structure includes a first conduction loop LP1, a second conduction loop LP2, a third conduction loop LP3, a fourth conduction loop LP4 and a shielding loop SLP. The first conduction loop LP1 passes through the left-bottom corner region CLB, the second conduction loop LP2 passes through the right-bottom corner region CRB, the third conduction loop LP3 passes through the left-bottom corner region CLB and the left-upper corner region CLU, and the fourth conduction loop LP4 passes through the right-bottom corner region CRB and the right-upper corner region CRU. Moreover, the shielding loop SLP electrically shields the electrical interference between the first through fourth conduction loops LP1~LP4.

The end nodes ENI and ENO1~ENO4 of the first through fourth conduction loops LP1~LP4 may be connected to the input-output circuit 200 via input-output lead lines LIO. The input-output lead lines LIO may be formed in various locations depending on the locations of the input-output circuit 200 and the end nodes ENI and ENO1~ENO4. Example embodiments of the input-output circuit 200 will be described below with reference to FIGS. 19 and 21. And, when compared with the structure of FIG. 3 in which portions of some horizontal lines overlap with other horizontal lines, the first through fourth conduction loops LP1~LP4 of FIG. 11 may be implemented with distinct horizontal lines, respectively.

Figure 12:
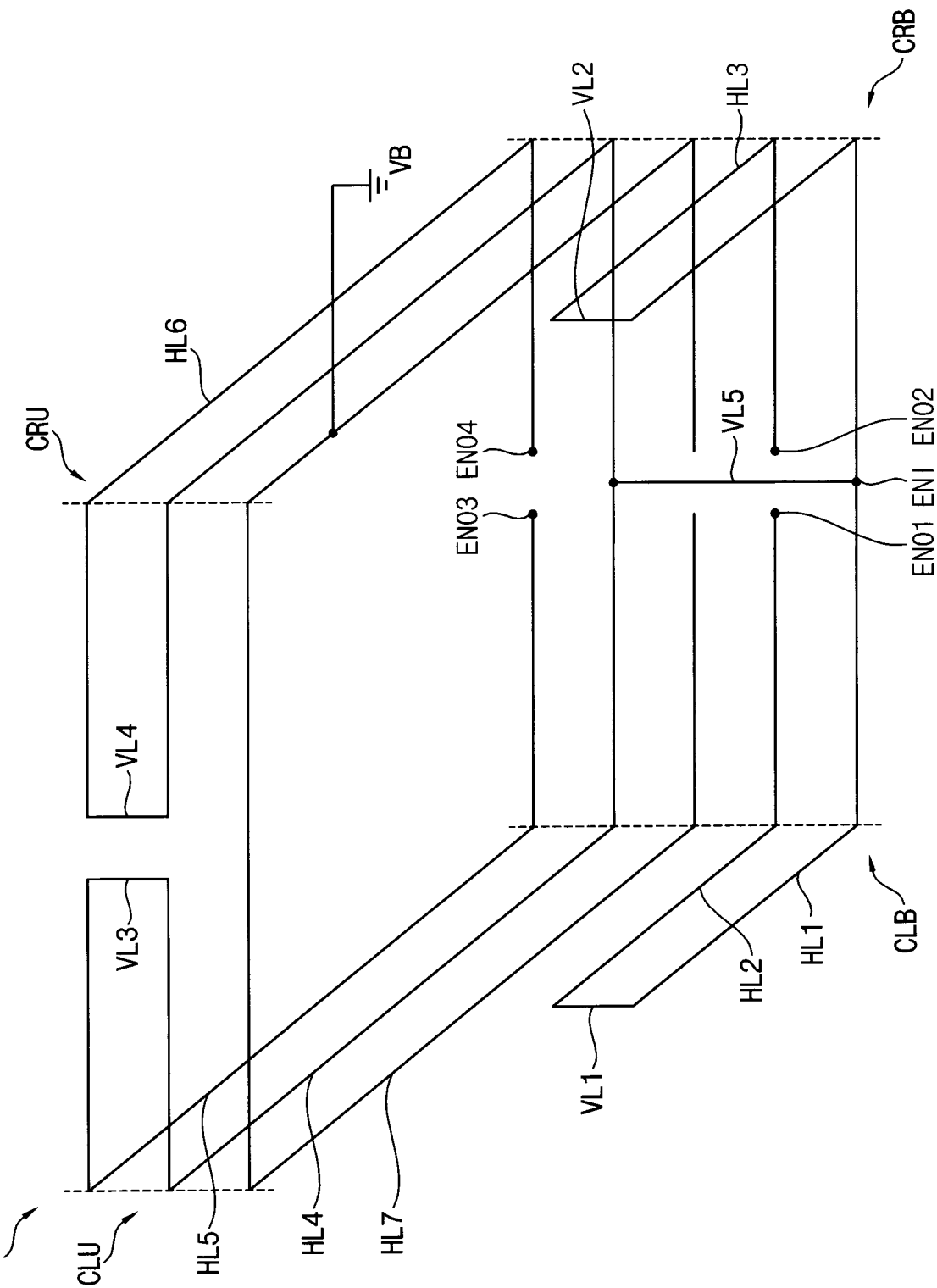
FIG. 12 is a perspective view illustrating a defect detection structure according to example embodiments.
Figure 13A:
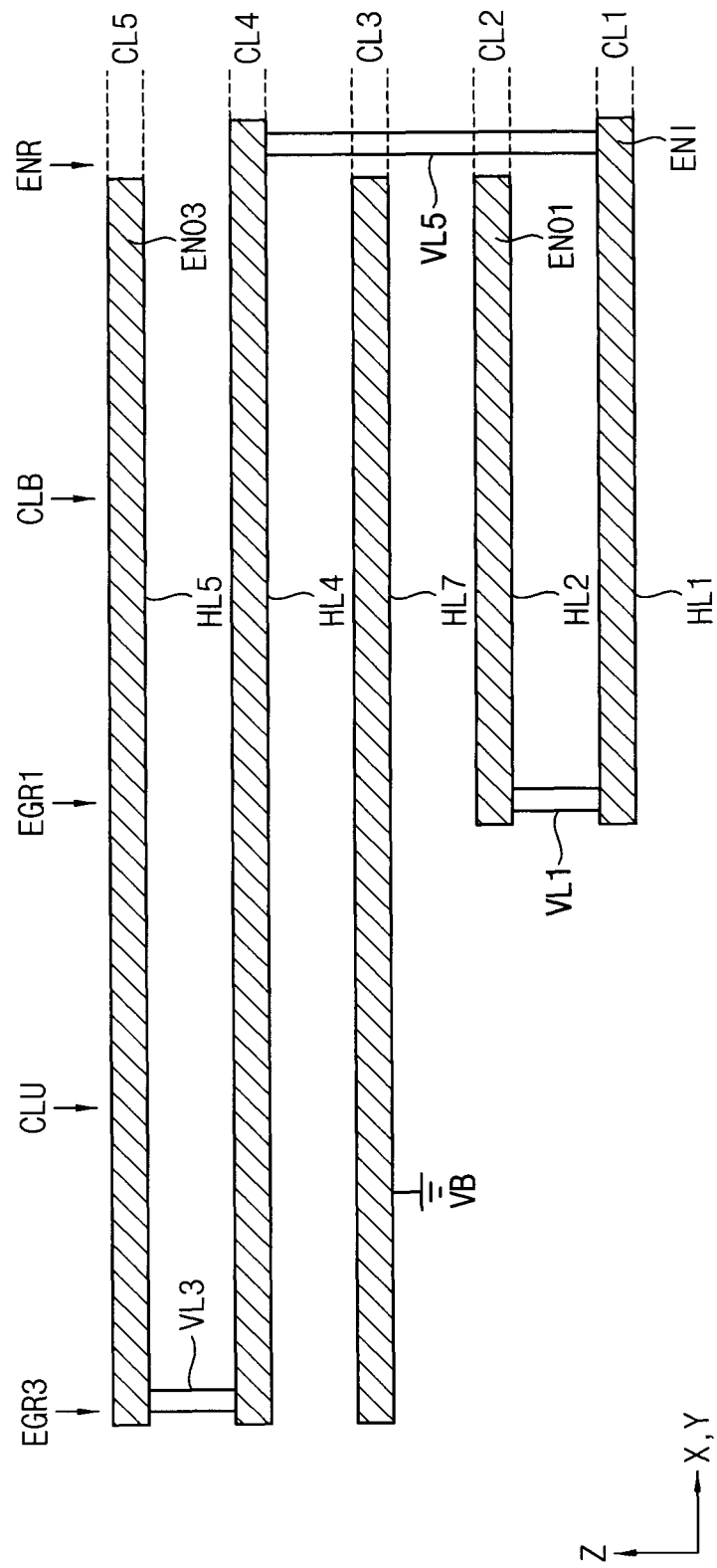
FIGS. 13A and 13B are cross-sectional views illustrating a vertical structure of a defect detection structure of FIG. 12.
Figure 13B:
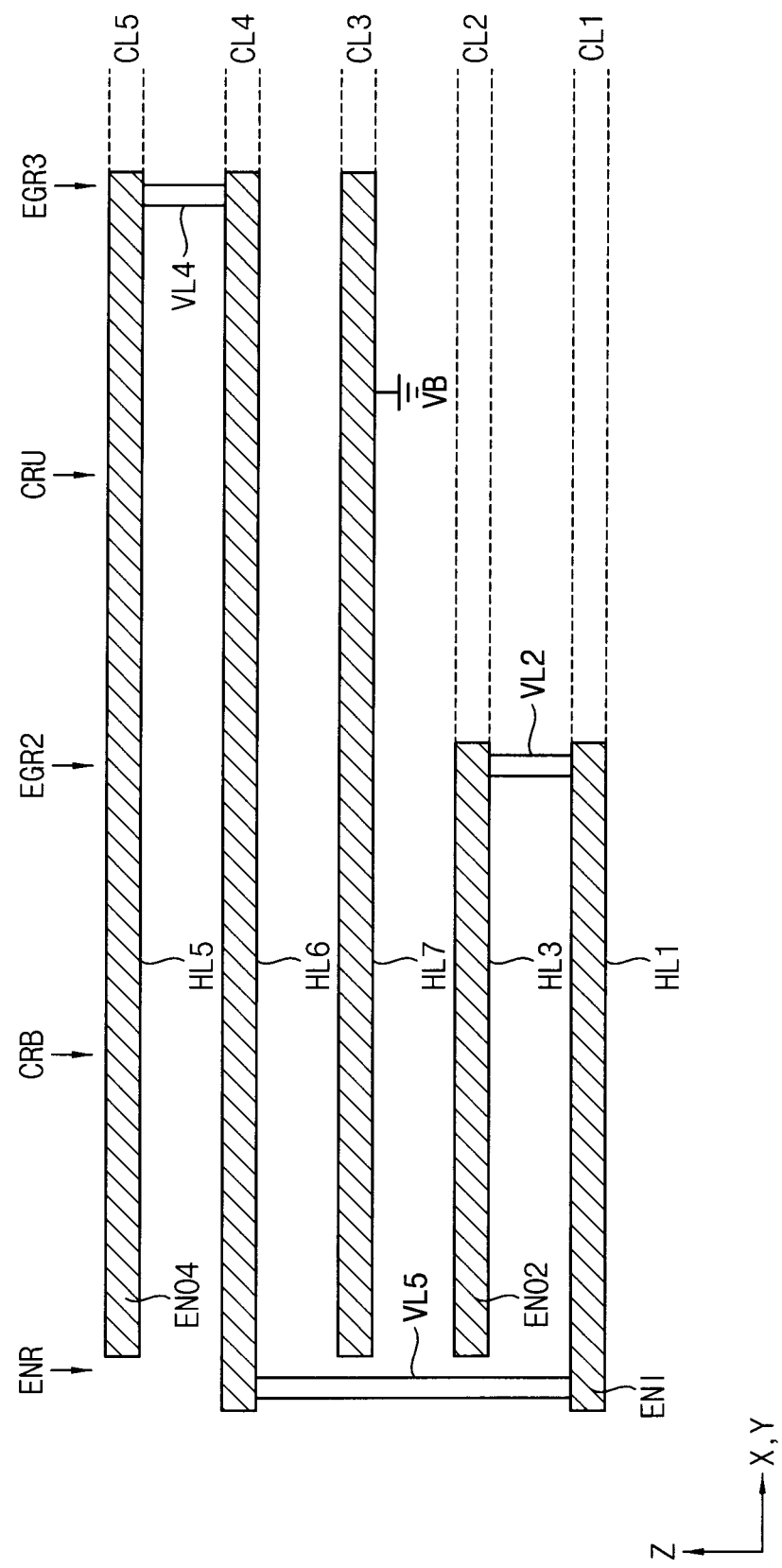

Hereinafter, example embodiments of the defect detection structure included in the semiconductor device 102 of FIG. 11 will be described below with reference to FIGS. 12, 13A and 13B. FIG. 12 is a perspective view illustrating a defect detection structure according to example embodiments, and FIGS. 13A and 13B are cross-sectional views illustrating a vertical structure of a defect detection structure of FIG. 12. The repeated descriptions with FIGS. 1 through 3 are omitted. FIG. 13A illustrates a cross-sectional view along the line A-A' in FIG. 1 and FIG. 13B illustrates a cross-sectional view along the line B-B' in FIG. 1.

Referring to FIGS. 12, 13A and 13B, a defect detection structure 13 may include a first horizontal line HL1, a second horizontal line HL2, a third horizontal line HL3, a fourth horizontal line HL4, a fifth horizontal line HL5, a sixth horizontal line HL6, a seventh horizontal line HL7, a first vertical line VL1, a second vertical line VL2, a third vertical line VL3, a fourth vertical line VL4 and a fifth vertical line VL5.

The first horizontal line HL1 is formed in the first conduction layer CL1. The first horizontal line HL1 extends from the first edge region ERG1 between the left-bottom corner region CLB and the left-upper corner region CLU to the second edge region ERG2 between the right-bottom corner region CRB and the right-upper corner region CRU by passing through the left-bottom corner region CLB and the right-bottom corner region CRB. In addition, the second horizontal line HL2 is formed in the second conduction layer CL2. The second horizontal line HL2 extends from a first output end node ENO1 located in the end node region ENR between the left-bottom corner region CLB and the right-bottom corner region CRB to the first edge region ERG1 by passing through the left-bottom corner region CLB.

The third horizontal line HL3 is formed in the second conduction layer CL2. The third horizontal line HL3 extends from a second output end node ENO2 located in the end node region ENR to the second edge region ERG2 by passing through the right-bottom corner region CRB. In addition, the fourth horizontal line HL4 is formed in the fourth conduction layer CL4. The fourth horizontal line HL4 of a ring shape extends along the peripheral region PREG by passing through the left-bottom corner region CLB, the left-upper corner region CLU, the right-upper corner region CRU and the right-bottom corner region CRB. The fourth horizontal line HL4 is cut in the third edge region ERG3 between the left-upper corner region CLU and the right-upper corner region CRU.

The fifth horizontal line HL5 is formed in the fifth conduction layer CL5. The fifth horizontal line HL5 extends from a third output end node ENO3 located in the end node region ENR to the third edge region ERG3 by passing through the left-bottom corner region CLB and the left-upper corner region CLU. In addition, the sixth horizontal line HL6 is formed in the fifth conduction layer CL5. The sixth horizontal line HL6 extends from a fourth output end node ENO4 located in the end node region ENR to the third edge region ERG3 by passing through the right-bottom corner region CRB and the right-upper corner region CRU.

The seventh horizontal line HL7 is formed in the third conduction layer CL3. The seventh horizontal line HL7 of a ring shape extends along the peripheral region PREG by passing through the left-bottom corner region CLB, the left-upper corner region CLU, the right-upper corner region CRU and the right-bottom corner region CRB.

The first vertical line VL1 connects the first horizontal line HL1 and the second horizontal line HL1 in the first edge region ERG1. The second vertical line VL2 connects the first horizontal line HL1 and the third horizontal line HL3 in the second edge region ERG2. The third vertical line VL3 connects the fourth horizontal line HL4 and the fifth horizontal line HL5 in the third edge region ERG3. The fourth vertical line VL4 connects the fourth horizontal line HL4 and the sixth horizontal line HL6 in the third edge region ERG3. The fifth vertical line VL5 connects the first horizontal line HL1 and the fourth horizontal line HL4 in the end node region ENR.

The first conduction loop LP1 in FIG. 11 includes a portion of the first horizontal line HL1 and the second horizontal line HL2. The second conduction loop LP2 in FIG. 11 includes a portion of the first horizontal line HL1 and the third horizontal line HL3. The third conduction loop LP3 in FIG. 11 includes a portion of the fourth horizontal line HL4 and the fifth horizontal line HL5. The fourth conduction loop LP4 in FIG. 11 includes a portion of the fourth horizontal line HL4 and the sixth horizontal line HL6. The shielding loop SLP in FIG. 11 includes the seventh horizontal line HL7. A constant bias voltage VB may be applied to the seventh horizontal line HL7 during a test operation to detect defects of the semiconductor device.

As such, the first conduction loop LP1 and the second conduction loop LP2 may be formed using the first conduction layer CL1 and the second conduction layer CL2, the shielding loop SLP may be formed using the third conduction layer CL3, and the third conduction loop LP3 and the fourth conduction loop LP4 may be formed using the fourth conduction layer CL4 and the fifth conduction layer CL5.

Figure 14:
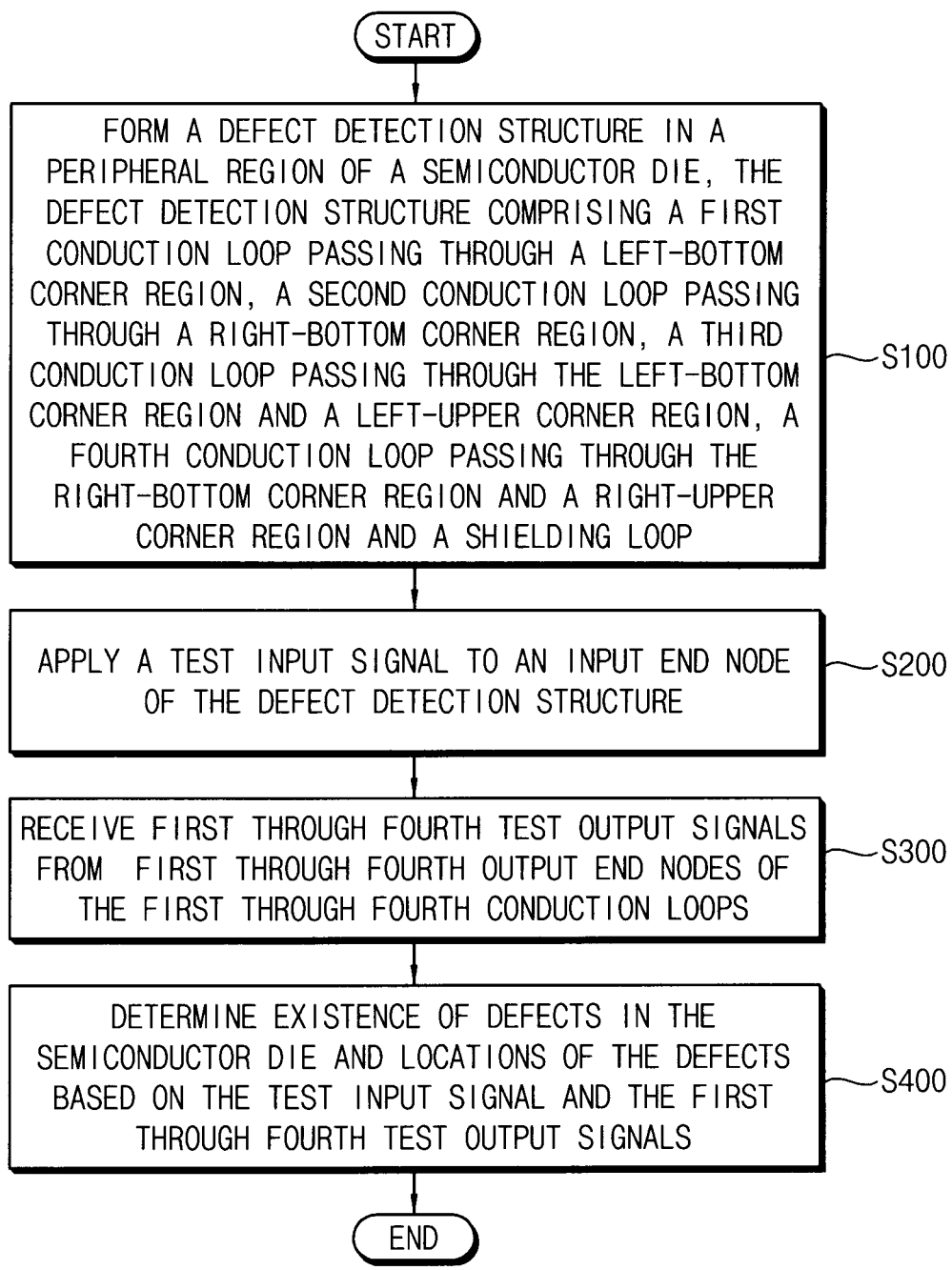
FIG. 14 is a flow chart illustrating a method of detecting defects in a semiconductor die according to example embodiments.

FIG. 14 is a flow chart illustrating a method of detecting defects in a semiconductor die according to example embodiments. As described above, a semiconductor die SD may include a central region CREG in which a semiconductor integrated circuit is formed and a peripheral region PREG surrounding the central region CREG. Referring to FIG. 14, a defect detection structure is formed in the peripheral region of a semiconductor die such that the defect detection structure includes a first conduction loop passing through a left-bottom corner region of the peripheral region PREG, a second conduction loop passing through a right-bottom corner region of the peripheral region PREG, a third conduction loop passing through the left-bottom corner region and a left-upper corner region of the peripheral region PREG, and a fourth conduction loop passing through the right-bottom corner region and a right-upper corner region of the peripheral region PREG. A shielding loop is also provided to at least partially shield electrical interference between the first through fourth conduction loops (S100).

According to the method, a test input signal may be applied to an input end node of the defect detection structure (S200). Then, first through fourth test output signals are received from first and fourth output end nodes of the first through fourth conduction loops (S300). And, then, an existence of at least one defect in the semiconductor die and locations of any defects are determined based on the test input signal and the first through fourth test output signals (S400).

Figure 15:
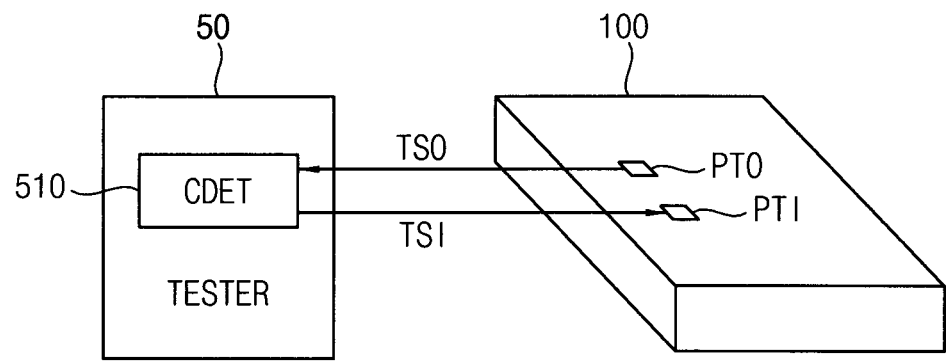
FIG. 15 is a block diagram illustrating a test system according to example embodiments.

FIG. 15 is a block diagram illustrating a test system according to example embodiments. Referring to FIG. 15, a test system may include a tester 50 and a semiconductor device 100. The semiconductor device 100 may include a defect detection structure including first through fourth conduction loops LP1~LP4 as described above. The first conduction loop LP1 may be an open loop passing through or in the left-bottom corner region CLB and the second conduction loop LP2 may be an open loop passing through the right-bottom corner region CRB. The third conduction loop LP3 may be an open loop passing through or in the left-bottom corner region CLB and the left-upper corner region CLU, and/or the fourth conduction loop LP4 may be an open loop passing through or in the right-bottom corner region CRB and the right-upper corner region CRU.

The input end node ENI and the first through fourth output end nodes ENO1~ENO4 of the first through fourth conduction loops LP1~LP4 may be connected to a test input pad PTI and a test output pad PTO that are formed on a surface of the semiconductor device 100. The first through fourth conduction loops LP1~LP4 may be electrically connected to the external tester 50 through the test input-output pads PTI and PTO.

The tester 50 may include a crack detector CDET 510. The crack detector 510 may apply the test input signal TSI to the test input pad PTI, and then receive the test output signal TSO through the test output pad PTO, where the test output signal TSO corresponds to the test input signal TSI after passing through the first through fourth conduction loops LP1~LP4. The crack detector 510 may determine existence or occurrence of the defects in the semiconductor die and locations of the defects by comparing the test input signal TSI and the test output signal TSO.

Figure 16:
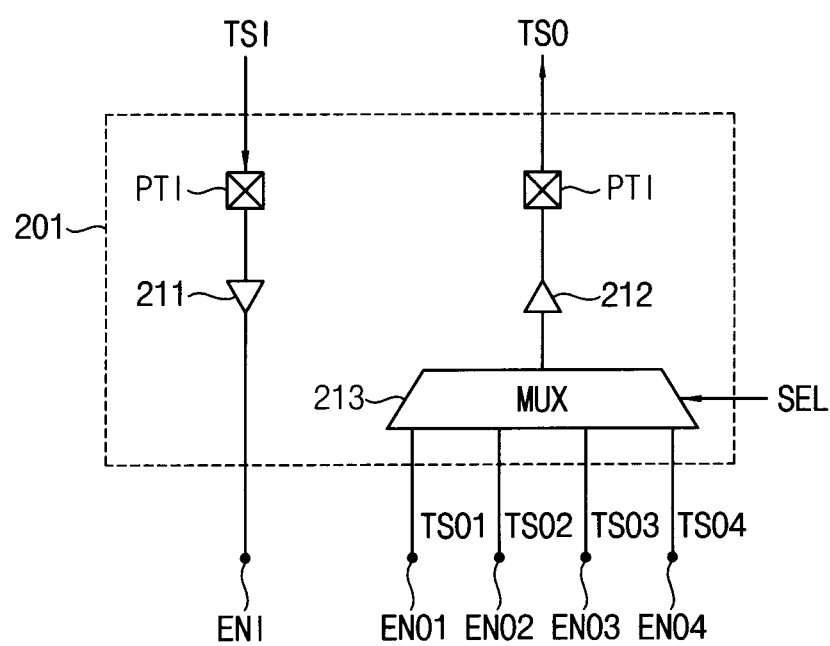
FIG. 16 is a circuit diagram illustrating an input-output circuit included in a semiconductor die according to example embodiments.
Figure 17:
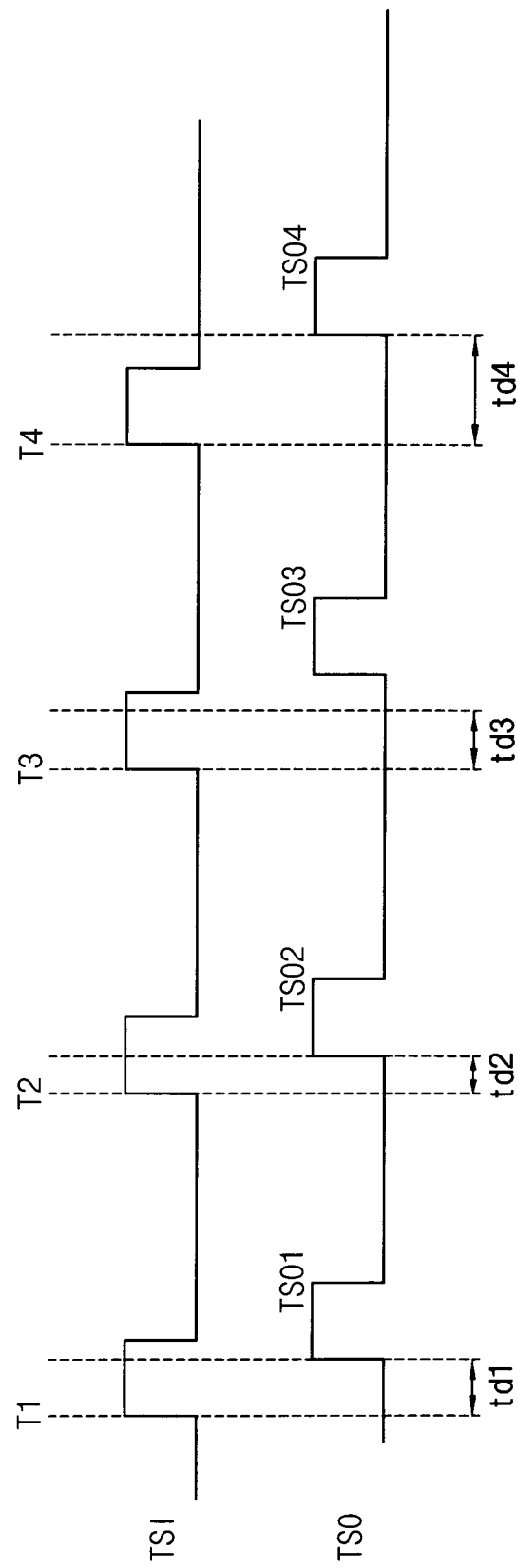
FIG. 17 is a timing diagram illustrating test signals of the input-output circuit of FIG. 16.

FIG. 16 is a circuit diagram illustrating an input-output circuit included in a semiconductor die according to example embodiments, and FIG. 17 is a timing diagram illustrating test signals of the input-output circuit of FIG. 16. Referring to FIG. 16, an input-output circuit 201 may include an input buffer 211, an output buffer 212, a selection circuit 213, a test input pad PTI and a test output pad PTO. In some example embodiments, the input buffer 211 and/or the output buffer 212 may be omitted. The test input pad PTI may be electrically connected to the input end node ENI to apply a test input signal TSI to the input end node ENI.

Figures 20, 21:
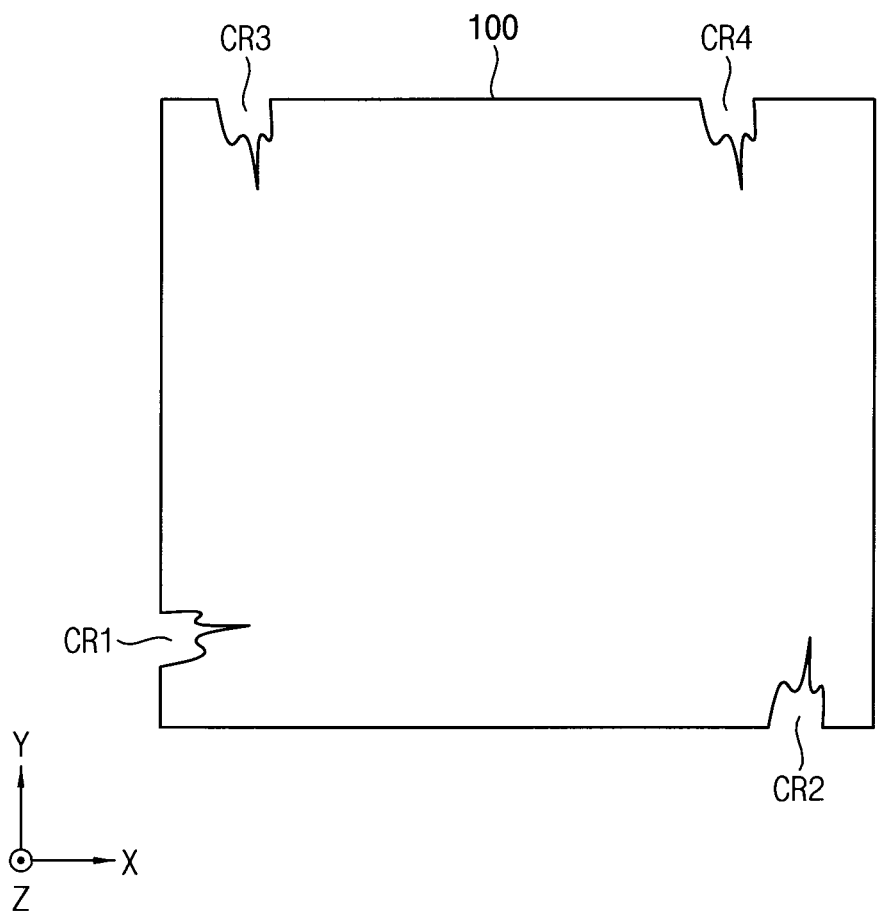
FIGS. 20 and 21 are diagrams for describing defect detection in a semiconductor device according to example embodiments.

The selection circuit 213 may connect the test output pad PTO sequentially to a first output end node ENO1 of the first conduction loop LP1, a second output end node ENO2 of the second conduction loop LP2, a third output end node ENO3 of the third conduction loop LP3 and a fourth output end node ENO4 of the fourth conduction loop LP4. As a result, as illustrated in FIG. 20, a test output signal TSO from the selection circuit 213 may sequentially include first through fourth test output signals TSO1~TSO4 corresponding to the test input signal STI passing through the first through fourth conduction loops LP1~LP4, respectively.

Referring to FIG. 17, the crack detector 510 in FIG. 15 may compare a phase of the test input signal TSI with phases of the first through fourth test output signals TSO1~TSO4 to measure phase differences or delay times td1~td4. The existence of the defects and the locations of the defects may be determined based on the delay times td1~td4. This crack detector 510 may generate the test input signal TSI that is activated in a form of pulses at time point T1~T4 to apply the test input signal TSI to the defect detection structure and receive the first through fourth test output signals TSO1~TSO4 sequentially from the defect detection structure. If any of the first through fourth test output signals TSO1~TSO4 does not include a pulse, it may be determined that the corresponding conduction loop is cut completely.

The first through fourth test output signals TSO1~TSO4 may have the first through fourth delay times td1~td4, respectively, with respect to the test input signal TSI. The defects such as cracks may be detected by comparing the first through fourth delay times td1~td4 with a reference value or by comparing mutually the first through fourth delay times td1~td4.

Figure 18:
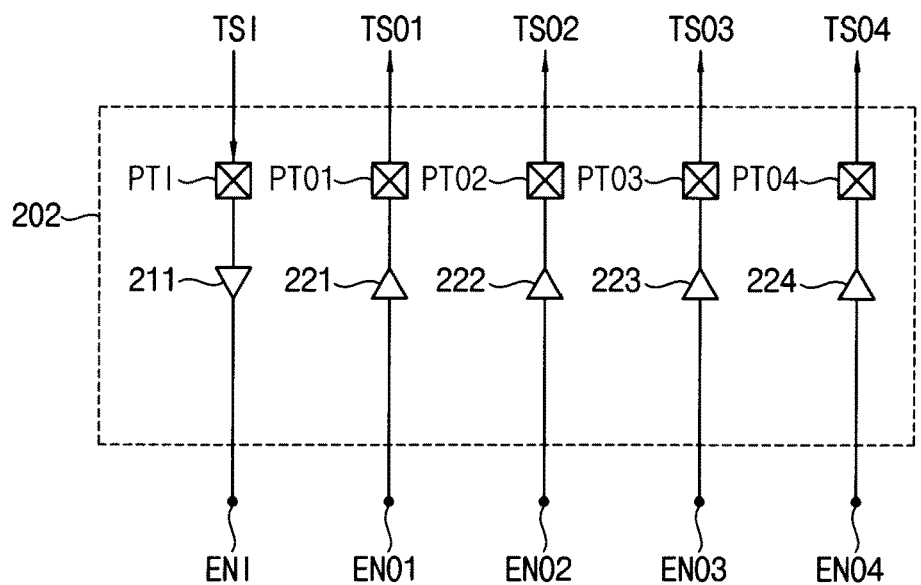
FIG. 18 is a circuit diagram illustrating an input-output circuit included in a semiconductor die according to example embodiments.
Figure 19:
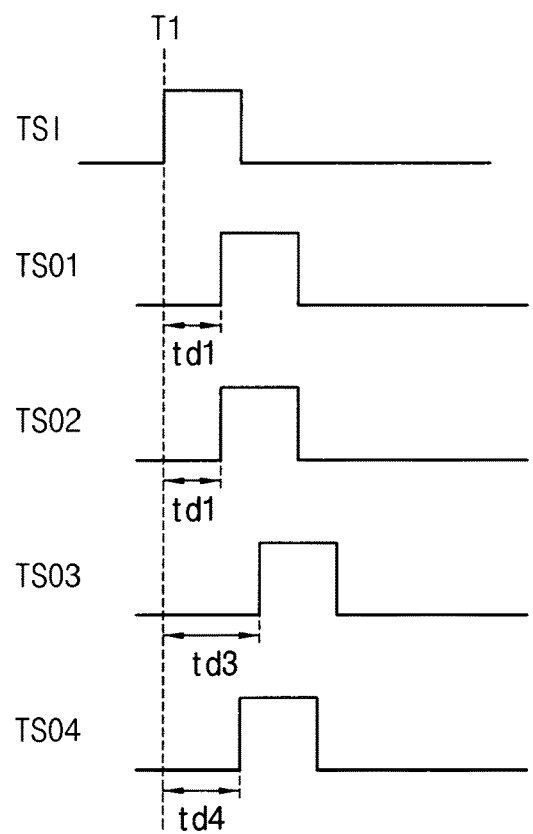
FIG. 19 is a timing diagram illustrating test signals of the input-output circuit of FIG. 18.

FIG. 18 is a circuit diagram illustrating an input-output circuit included in a semiconductor die according to example embodiments. FIG. 19 is a timing diagram illustrating test signals of the input-output circuit of FIG. 18. Referring to FIG. 18, an input-output circuit 202 may include an input buffer 211, output buffers 221, 222, 223 and 224, a test input pad PTI and first through fourth test output pads PTO1~PTO4. In some example embodiments, the input buffer 211 and/or the output buffers 221, 222, 223 and 224 may be omitted.

Figure 22:
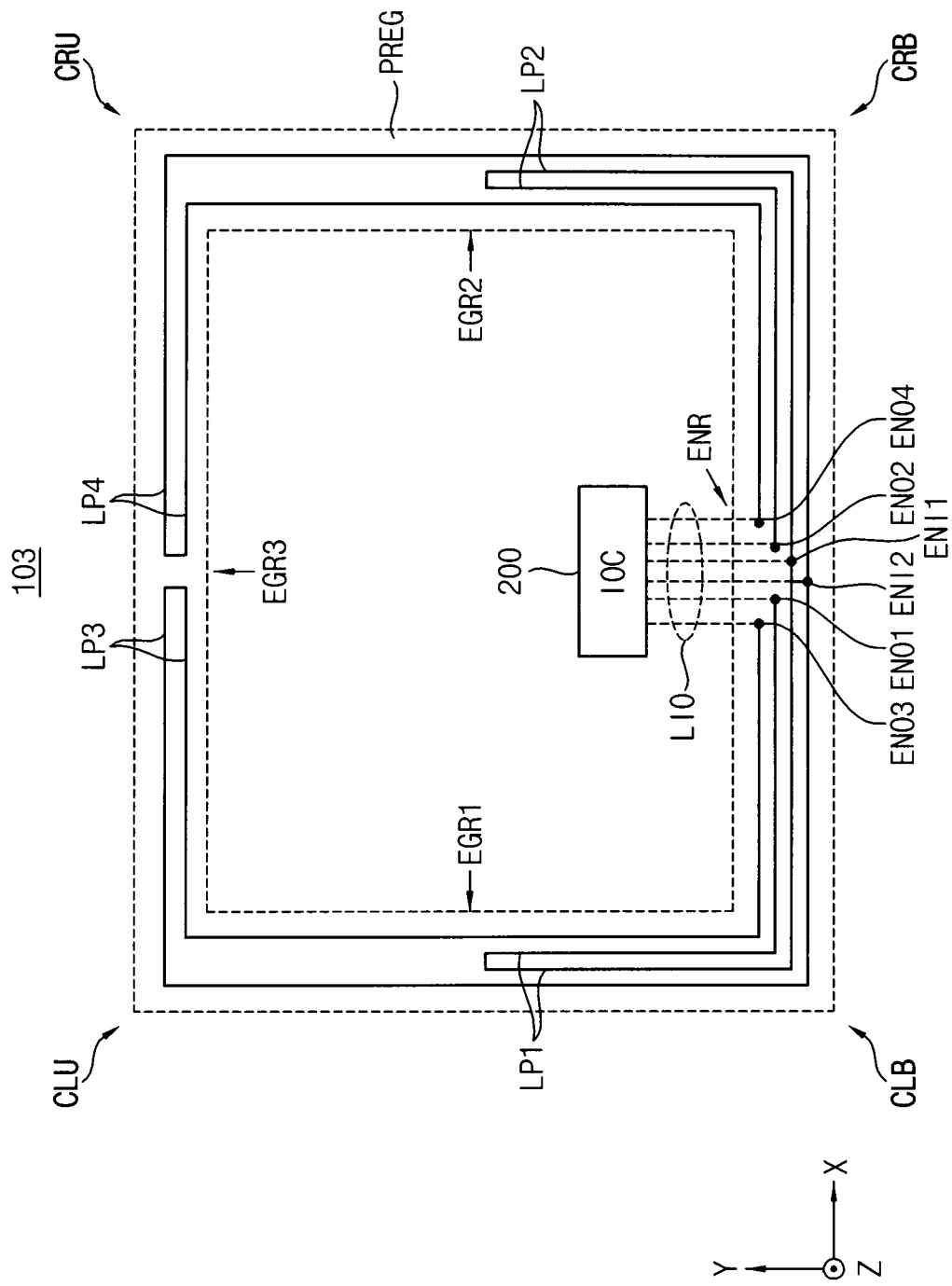
FIG. 22 is a diagram illustrating a semiconductor device according to example embodiments.

The test input pad PTI may be electrically connected to the input end node ENI to apply a test input signal TSI to the input end node ENI. The first through fourth test output pads PTO1~PTO4 may be electrically connected to first through fourth output end nodes ENO1~ENO4, respectively. As a result, as illustrated in FIG. 22, first through fourth test output signals TSO1~TSO4 corresponding to the test input signal STI passing through the first through fourth conduction loops LP1~LP4, respectively, may be provided in parallel.

Referring to FIG. 19, the crack detector 510 in FIG. 15 may compare a phase of the test input signal TSI with phases of the first through fourth test output signals TSO1~TSO4 to measure phase differences or delay times td1~td4. The existence of the defects and the locations of the defects may be determined based on the delay times td1~td4. FIG. 18 illustrates the case of the four test output pads PTO1~PTO4, but example embodiments are not limited thereto. In some example embodiments, using a selection circuit similar to that of FIG. 16, two of the first through fourth signals TSO1~TSO4 may be provided in parallel through two test output pads and then the other two of the first through fourth signals TSO1~TSO4 may be provided in parallel.

The crack detector 510 may generate the test input signal TSI that is activated in a form of a pulse at a time point T1 to apply the test input signal TSI to the defect detection structure and receive the first through fourth test output signals TSO1~TSO4 in parallel from the defect detection structure. If any of the first through fourth test output signals TSO1~TSO4 does not include a pulse, it may be determined that the corresponding conduction loop is cut completely.

The first through fourth test output signals TSO1~TSO4 may have the first through fourth delay times td1~td4, respectively, with respect to the test input signal TSI. The defects, such as cracks, may be detected by comparing the first through fourth delay times td1~td4 with a reference value or by comparing mutually the first through fourth delay times td1~td4.

FIGS. 20 and 21 are diagrams for describing defect detection in a semiconductor device according to example embodiments. Referring to FIG. 20, cracks of various locations may be induced, for example, during a process of sawing a wafer. A first crack CR1 indicates a defect near the left-bottom corner region CLB, a second crack CR2 indicates a defect near the right-bottom corner region CRB, a third crack CR3 indicates a defect near the left-upper corner region CLU, and a fourth crack CR4 indicates a defect near the right-upper corner region CRU. The defect detection structure according to example embodiments may efficiently detect the locations of the defects such as the cracks in addition to the existence of the defects, using the plurality of conduction loops LP1~LP4 passing through different combinations of the corner regions.

FIG. 21 illustrates delays of the first through fourth conduction loops LP1~LP4 according to locations or positions of the cracks CR1~CR4. In FIG. 21, DEL indicates the delay time exceeds a reference value to indicate that the defect occurs in the corresponding conduction loop and NOR indicates the delay time is shorter that the reference value to indicate that the corresponding conduction loop does not include the defect. As such, the measured result of the first through fourth conduction loops LP1~LP4 may have the different combinations depending on the locations of the cracks, and thus the locations of the cracks may be determined.

In the defect detection structure as described with reference to FIGS. 1 through 13B, the first conduction loop LP1 and the second conduction loop LP2 are symmetric bilaterally and the third conduction loop LP3 and the fourth conduction loop LP4 are symmetric bilaterally. In such symmetric structures, the first conduction loop LP1 and the second conduction loop LP2 may have substantially the same delay time and also the third conduction loop LP3 and the fourth conduction loop LP4 may have substantially the same delay time. The locations of the defects may be determined regardless of the test input signal TSI by comparing the mutual delay of the first test output signal TSO1 and the second test output signal TSO2, and by comparing the mutual delay of the third test output signal TSO3 and the fourth test output signal TSO4.

FIG. 22 is a diagram illustrating a semiconductor device according to example embodiments. The semiconductor device 103 of FIG. 22 is substantially the same as the semiconductor device 102 of FIG. 11 except the end nodes, and the repeated descriptions are omitted. The semiconductor device 103 may not include a shielding loop as will be described with reference to FIG. 23, or include a shielding loop as will be described with reference to FIG. 24.

Referring to FIG. 22, end nodes of the first through fourth conduction loops LP1~LP4, that is, a first input end node ENI1, a second input end node ENI2, a first output end node ENO1, a second output end node ENO2, a third output end node ENO3 and a fourth output end node ENO4 may be located in the end node region ENR. In the semiconductor device 102 of FIG. 11, the first through fourth conduction loops LP1~LP4 have a common input end node ENI. In contrast, in the semiconductor device 103 of FIG. 22, the first and second conduction loops LP1 and LP2 have the common first input end node ENI1, and the third and fourth conduction loops LP3 and LP4 have the common second input end node ENI2.

The first input end node ENI1 may be electrically disconnected from the second input end node ENI2, and a first input signal and a second test input signal may be applied to the first input end node ENI1 and the second input end node ENI2, respectively. In this case, even though a crack occurs in one of the first conduction loop LP1 and the third conduction loop LP3, the noises due to the electrical interference may be reduced because the independent test input signal is input to the other of the first conduction loop LP1 and the third conduction loop LP3. Even though not illustrated in figures, the first through fourth conduction loops LP1~LP4 may be electrically disconnected from one another and four independent test input signals may be applied to four respective input end nodes of the first through fourth conduction loops LP1~LP4.

Figure 23:
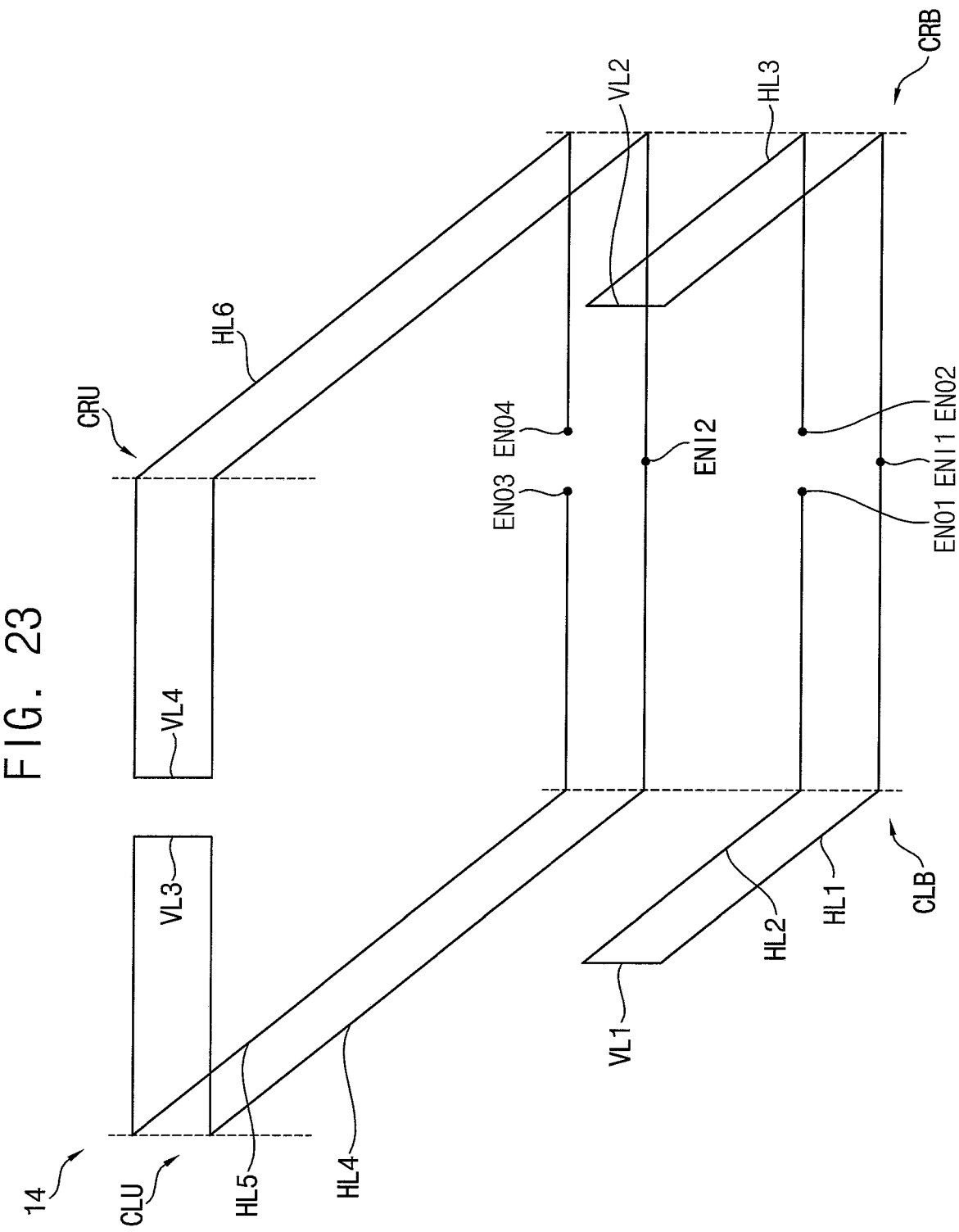
FIGS. 23 and 24 are perspective views illustrating a defect detection structure according to example embodiments.

FIGS. 23 and 24 are perspective views illustrating a defect detection structure according to example embodiments. A defect detection structure 14 of FIG. 23 and a defect detection structure 15 of FIG. 24 are similar to the defect detection structure 13 as described with reference to FIGS. 12, 13A and 13B, and the repeated descriptions are omitted.

Referring to FIG. 23, in the defect detection structure 14, the first conduction loop LP1 and the second conduction loop LP2 have the common first input end node ENI1, and the third conduction loop LP3 and the fourth conduction loop LP4 have the common second input end node ENI2. The first test input signal and the second test input signal, which are independent from each other, may be applied to the first and second input end nodes ENI1 and ENI2, respectively. In this case, the noises due to the electrical interference between the first conduction loop LP1 and the third conduction loop LP3 and the electrical interference between the second conduction loop LP2 and the fourth conduction loop LP4 may be reduced by applying the independent test input signals. In this case, the shielding loop SLP in FIG. 12 may be omitted as illustrated in FIG. 23.

The defect detection structure 15 of FIG. 24 is the same as the defect detection structure 13 of FIG. 12, except the first input end node ENI1 and the second input end node ENI2. In case of the defect detection structure 15, electrical noise due to the electrical interference may be further reduced by including the shielding loop SLP as well as the independent application of the test input signals.

Figure 25:
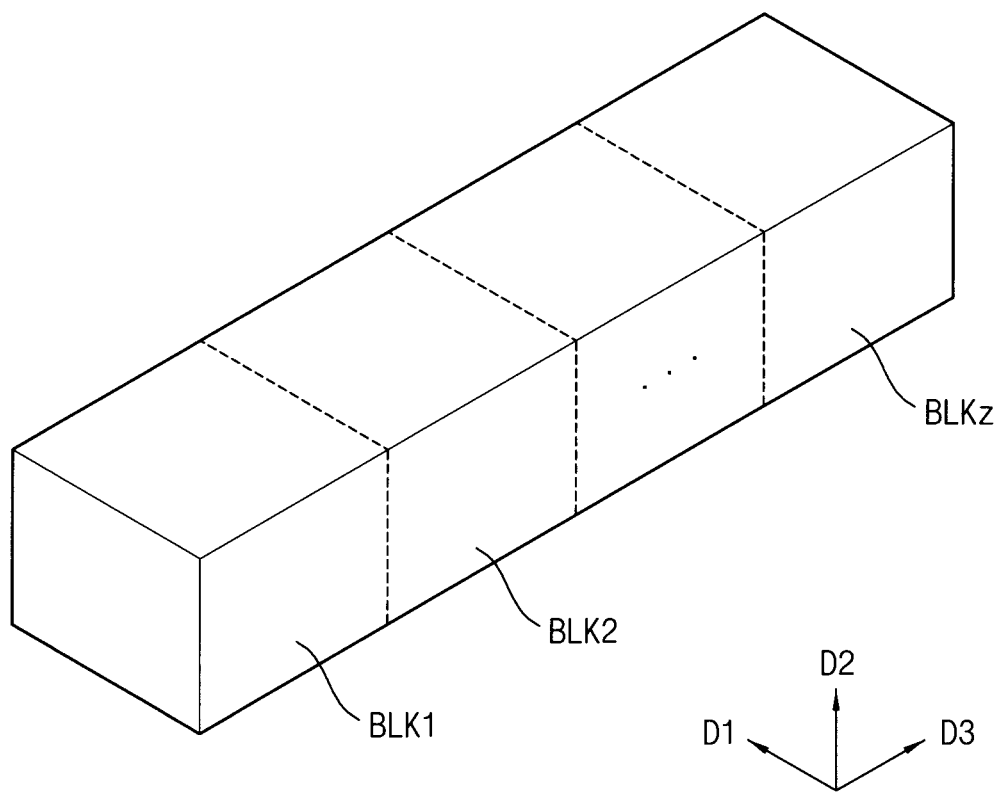
FIG. 25 is a block diagram illustrating a memory cell array included in a NAND flash memory device that may be integrated in a semiconductor device.
Figure 26:
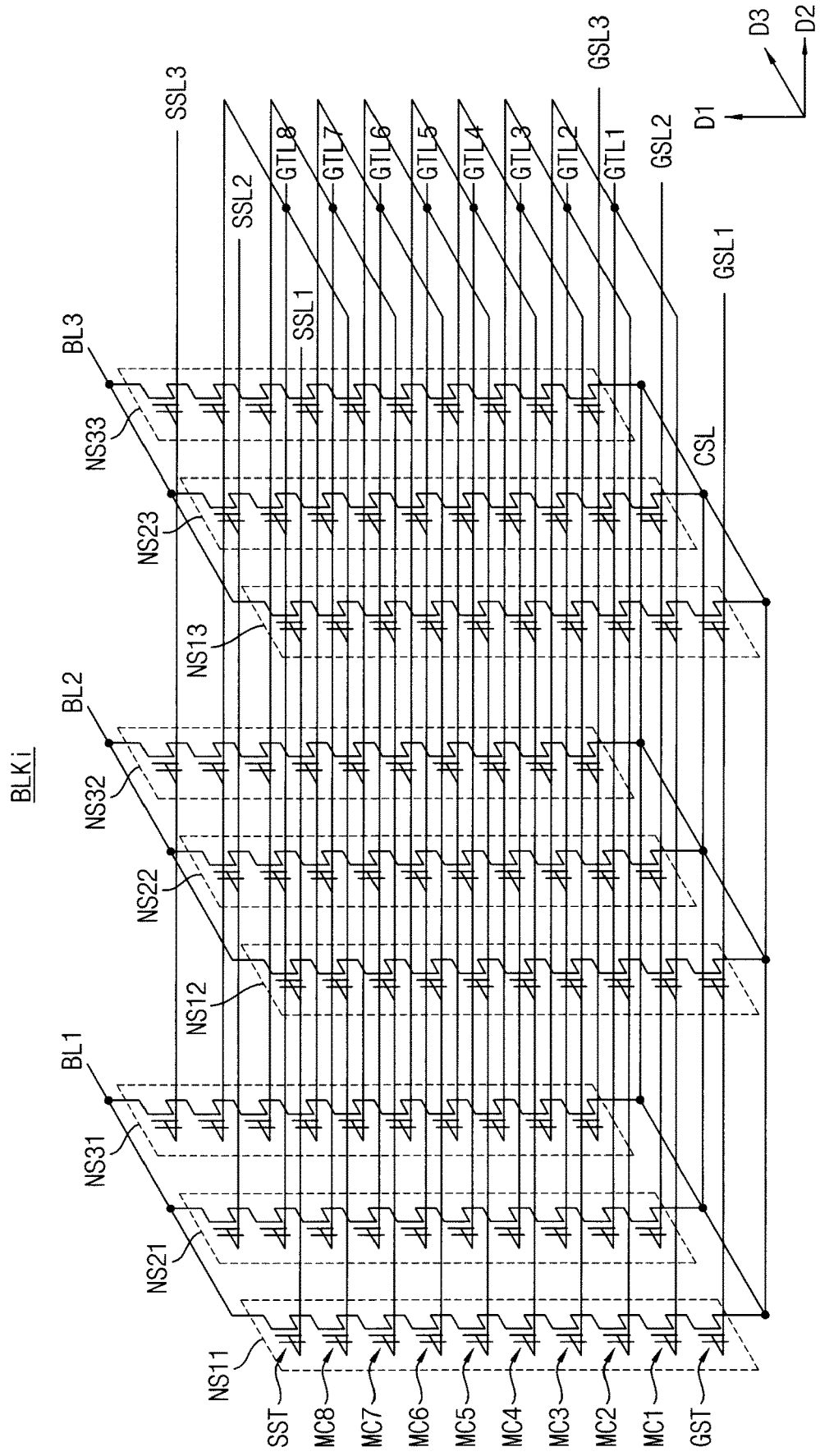
FIG. 26 is a circuit diagram illustrating an equivalent circuit of the memory block in the memory cell array of FIG. 25.

FIG. 25 is a block diagram illustrating a memory cell array included in a NAND flash memory device that may be integrated in a semiconductor device. FIG. 26 is a circuit diagram illustrating an equivalent circuit of the memory block in the memory cell array of FIG. 25. Referring to FIG. 25, a memory cell array 400 of a NAND flash memory device may include a plurality of memory blocks BLK1 to BLKz. In an example embodiment, the memory blocks BLK1 to BLKz may be selected by an address decoder in the NAND flash memory device. For example, the address decoder may select a particular memory block corresponding to a block address among the memory blocks BLK1 to BLKz.

In FIGS. 25 and 26, a first direction D1 indicates a vertical direction perpendicular to an upper surface of a semiconductor substrate, a second direction D2 and a third direction D3 indicate two orthogonal directions parallel to the upper surface of the semiconductor substrate. The memory block BLKi of FIG. 26 may be formed on the semiconductor substrate in a three-dimensional structure (or a vertical structure). For example, a plurality of NAND strings or cell strings included in the memory block BLKi may extend in the first direction D1.

Referring to FIG. 26, the memory block BLKi may include NAND strings NS11 to NS33 coupled between bit lines BL1, BL2 and BL3 and a common source line CSL. Each of the NAND strings NS11 to NS33 may include a string selection transistor SST, a plurality of memory cells MC1 to MC8, and a ground selection transistor GST. In FIG. 26, each of the NAND strings NS11 to NS33 is illustrated to include eight memory cells MC1 to MC8. However, example embodiments are not limited thereto. In some example embodiments, each of the NAND strings NS11 to NS33 may include any number of memory cells.

Each string selection transistor SST may be connected to a corresponding string selection line (one of SSL1 to SSL3). The plurality of memory cells MC1 to MC8 may be connected to corresponding gate lines GTL1 to GTL8, respectively. The gate lines GTL1 to GTL8 may be word lines and some of the gate lines GTL1 to GTL8 may be dummy word lines. Each ground selection transistor GST may be connected to a corresponding ground selection line (one of GSL1 to GSL3). Each string selection transistor SST may be connected to a corresponding bit line (e.g., one of BL1, BL2 and BL3), and each ground selection transistor GST may be connected to the common source line CSL.

Word lines (e.g., WL1) having the same height may be commonly connected, and the ground selection lines GSL1 to GSL3 and the string selection lines SSL1 to SSL3 may be separated. In FIG. 26, the memory block BLKi is illustrated to be coupled to eight gate lines GTL1 to GTL8 and three bit lines BL1 to BL3. However, example embodiments are not limited thereto. Each memory block in the memory cell array 400 may be coupled to any number of word lines and any number of bit lines.

FIGS. 25 and 26 illustrate a non-limiting example embodiment that the semiconductor device according to example embodiments corresponds to the vertical NAND flash memory device, and the defect detection structure may be applied to any semiconductor device that is manufactured using semiconductor dies.

Figure 27:
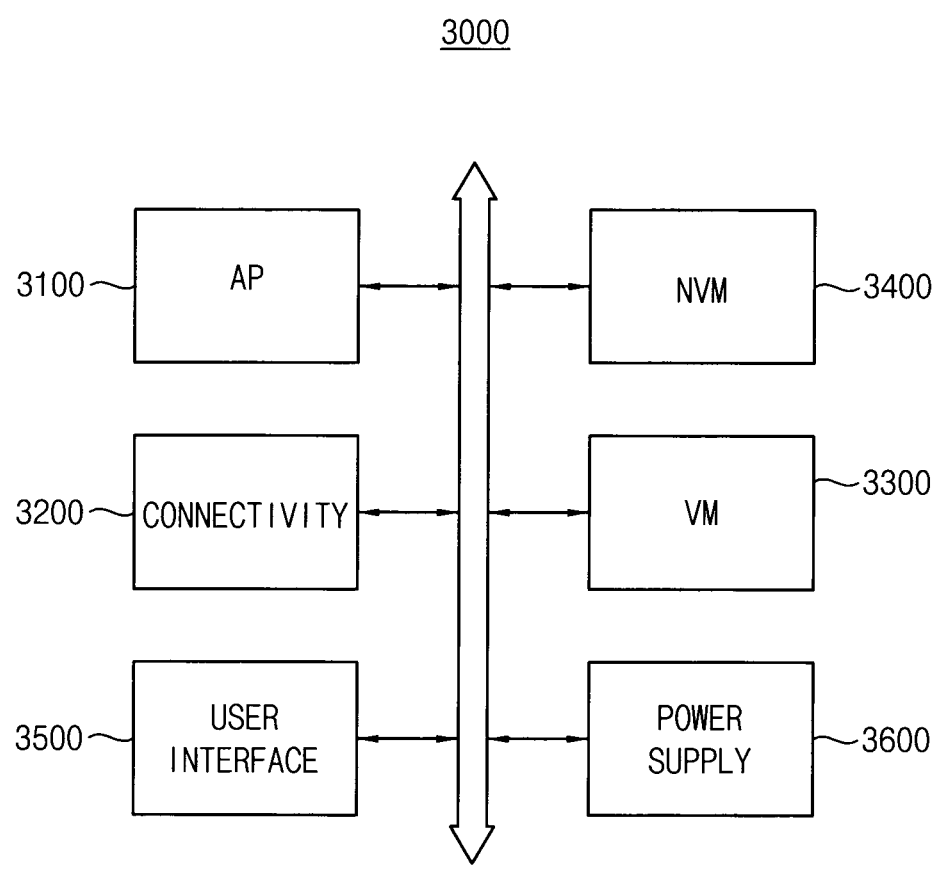
FIG. 27 is a block diagram illustrating a mobile system according to example embodiments.

FIG. 27 is a block diagram illustrating a mobile system according to example embodiments. Referring to FIG. 27, a mobile system 3000 includes an application processor 3100, a connectivity unit 3200, a volatile memory device VM 3300, a nonvolatile memory device NVM 3400, a user interface 3500, and a power supply 3600 connected via a bus.

The application processor 3100 may execute applications such as a web browser, a game application, a video player, etc. The connectivity unit 3200 may perform wired or wireless communication with an external device. The volatile memory device 3300 may store data processed by the application processor 3100, or may operate as a working memory. For example, the volatile memory device 3300 may be a DRAM, such as a double data rate synchronous dynamic random access memory (DDR SDRAM), low power DDR (LPDDR) SDRAM, graphics DDR (GDDR) SDRAM, Rambus DRAM (RDRAM), etc. The nonvolatile memory device 3400 may store a boot image for booting the mobile system 3000 and other data. The user interface 3500 may include at least one input device, such as a keypad, a touch screen, etc., and at least one output device, such as a speaker, a display device, etc. The power supply 3600 may supply a power supply voltage to the mobile system 3000. In example embodiments of the inventive concepts, the mobile system 3000 may further include a camera image processor (CIS), and/or a storage device, such as a memory card, a solid state drive (SSD), a hard disk drive (HDD), a compact disc read only memory (CD-ROM), etc.

The volatile memory device 3300 and/or the nonvolatile memory device 3400 may be implemented as a semiconductor device including the defect detection structure as described above. The defect detection structure includes a first conduction loop, a second conduction loop, a third conduction loop, a fourth conduction loop and a shielding loop. The first conduction loop passes through a left-bottom corner region CLB of the peripheral region PREG. The second conduction loop passes through a right-bottom corner region CRB of the peripheral region PREG. The third conduction loop passes through the left-bottom corner region CLB and a left-upper corner region CLU of the peripheral region PREG. The fourth conduction loop passes through the right-bottom corner region CRB and a right-upper corner region CRU of the peripheral region PREG. The shielding loop shields the electrical interference between the first through fourth conduction loops.

As described above, the defect detection structure, the semiconductor device and the associated method according to example embodiments may detect crack penetration of various types accurately using the plurality of conduction loops and the shielding loop formed in the peripheral region surrounding the central region in which the semiconductor integrated circuit is formed. The defect detection structure, the semiconductor device and the associated method according to example embodiments may prevent yield of bad products with enhanced detectability of the crack.

The present inventive concept may be applied to any electronic devices and systems formed using semiconductor dies. For example, the defect detection structure according to example embodiments may be applied to systems such as be a memory card, a solid state drive (SSD), an embedded multimedia card (eMMC), a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, a wearable device, an internet of things (IoT) device, an internet of everything (IoE) device, an e-book, a virtual reality (VR) device, an augmented reality (AR) device, etc.

The foregoing is illustrative of example embodiments and is not to be construed as limiting thereof. Although a few example embodiments have been described, those skilled in the art will readily appreciate that many modifications are possible in the example embodiments without materially departing from the present inventive concept.

What is claimed is:

1. A semiconductor device, comprising:
a semiconductor die including a central region in which a semiconductor integrated circuit is formed, and a peripheral region surrounding at least a portion of the central region, the peripheral region including a left-bottom corner region, a left-upper corner region, a right-upper corner region and a right-bottom corner region;
a defect detection structure formed in the peripheral region, the defect detection structure comprising a first conduction loop passing through the left-bottom corner region, a second conduction loop passing through the right-bottom corner region, a third conduction loop passing through the left-upper corner region, and a fourth conduction loop passing through the right-upper corner region; and
a shielding loop configured to at least partially shield the first through fourth conduction loops from electrical interference therebetween.

2. The semiconductor device of claim 1, wherein the third conduction loop is configured to pass through the left-bottom corner region and the left-upper corner region; and wherein the fourth conduction loop is configured to pass through the right-bottom corner region and the right-upper corner region.

3. The semiconductor device of claim 1, wherein a constant bias voltage is applied to at least one bias node on the shielding loop during a test operation to detect defects of the semiconductor device.

4. The semiconductor device of claim 2, wherein a first portion of the shielding loop is disposed at a position to at least partially shield electrical interference between a horizontal line of the first conduction loop and a horizontal line of the third conduction loop; and wherein a second portion of the shielding loop is disposed at a position to at least partially shield electrical interference between a horizontal line of the second conduction loop and a horizontal line of the fourth conduction loop.

5. The semiconductor device of claim 2, wherein at least a portion of the shielding loop is disposed at a position to at least partially shield electrical interference between two horizontal lines respectively included in the first through fourth conduction loops.

6. The semiconductor device of claim 2, wherein the defect detection structure is formed in a plurality of conduction layers as a ring-shaped three-dimensional structure that at least partially surrounds the central region.

7. The semiconductor device of claim 2, wherein horizontal lines of the first conduction loop and the second conduction loop are formed in a first conduction layer and a second conduction layer; wherein horizontal lines of the shielding loop are formed in a third conduction layer; and wherein the third conduction loop and the fourth conduction loop are formed in the first conduction layer and a fourth conduction layer.

8. The semiconductor device of claim 2, wherein the defect detection structure comprises:
   a first horizontal line formed in a first conduction layer, the first horizontal line of a ring shape extending along the peripheral region by passing through the left-bottom corner region, the left-upper corner region, the right-upper corner region and the right-bottom corner region, and the first horizontal line being cut in a third edge region between the left-upper corner region and the right-upper corner region;
   a second horizontal line formed in a second conduction layer, the second horizontal line extending from an end node region between the left-bottom corner region and the right-bottom corner region to a first edge region between the left-bottom corner region and the left-upper corner region, and passing through the left-bottom corner region;
   a third horizontal line formed in the second conduction layer, the third horizontal line extending from the end node region between the left-bottom corner region and the right-bottom corner region to a second edge region between the right-bottom corner region and the right-upper corner region, and passing through the right-bottom corner region;
   a fourth horizontal line formed in a fourth conduction layer, the fourth horizontal line extending from the end node region between the left-bottom corner region and the right-bottom corner region to the third edge region by passing through the left-bottom corner region and the left-upper corner region;
   a fifth horizontal line formed in the fourth conduction layer, the fifth horizontal line extending from the end node region between the left-bottom corner region and the right-bottom corner region to the third edge region by passing through the right-bottom corner region and the right-upper corner region;
   a sixth horizontal line formed in a third conduction layer, the sixth horizontal line of a ring shape extending along the peripheral region by passing through the left-bottom corner region, the left-upper corner region, the right-upper corner region and the right-bottom corner region, the sixth horizontal line being cut in the third edge region;
   a first vertical line electrically connecting the first horizontal line and the second horizontal line in the first edge region;
   a second vertical line electrically connecting the first horizontal line and the third horizontal line in the second edge region;
   a third vertical line electrically connecting the first horizontal line and the fourth horizontal line in the third edge region; and
   a fourth vertical line electrically connecting the first horizontal line and the fifth horizontal line in the third edge region.

9. The semiconductor device of claim 2, wherein horizontal lines of the first conduction loop and the second conduction loop are formed in a first conduction layer and a second conduction layer, horizontal lines of the shielding loop are formed in a third conduction layer, and horizontal lines of the third conduction loop and the fourth conduction loop are formed in a fourth conduction layer and a fifth conduction layer.

10. The semiconductor device of claim 2, wherein the defect detection structure comprises:
    a first horizontal line formed in a first conduction layer, the first horizontal line extending from a first edge region between the left-bottom corner region and the left-upper corner region to a second edge region between the right-bottom corner region and the right-upper corner region by passing through the left-bottom corner region and the right-bottom corner region;
    a second horizontal line formed in a second conduction layer, the second horizontal line extending from an end node region between the left-bottom corner region and the right-bottom corner region to the first edge region by passing through the left-bottom corner region;
    a third horizontal line formed in the second conduction layer, the third horizontal line extending from the end node region between the left-bottom corner region and the right-bottom corner region to a second edge region by passing through the right-bottom corner region;
    a fourth horizontal line formed in a fourth conduction layer, the fourth horizontal line of a ring shape extending along the peripheral region by passing through the left-bottom corner region, the left-upper corner region, the right-upper corner region and the right-bottom corner region, the fourth horizontal line being cut in a third edge region between the left-upper corner region and the right-upper corner region;
    a fifth horizontal line formed in a fifth conduction layer, the fifth horizontal line extending from the end node region between the left-bottom corner region and the right-bottom corner region to the third edge region by passing through the left-bottom corner region and the left-upper corner region;
    a sixth horizontal line formed in the fifth conduction layer, the sixth horizontal line extending from the end node region between the left-bottom corner region and the right-bottom corner region to the third edge region by passing through the right-bottom corner region and the right-upper corner region;
    a seventh horizontal line formed in a third conduction layer, the seventh horizontal line of a ring shape extending along the peripheral region by passing through the left-bottom corner region, the left-upper corner region, the right-upper corner region and the right-bottom corner region;
    a first vertical line electrically connecting the first horizontal line and the second horizontal line in the first edge region;
    a second vertical line electrically connecting the first horizontal line and the third horizontal line in the second edge region;
    a third vertical line electrically connecting the fourth horizontal line and the fifth horizontal line in the third edge region;
    a fourth vertical line electrically connecting the fourth horizontal line and the sixth horizontal line in the third edge region; and
    a fifth vertical line electrically connecting the first horizontal line and the fourth horizontal line in the end node region.

11. The semiconductor device of claim 2, wherein the shielding loop includes a plurality of conduction loops respectively formed in a plurality of conduction layers, and the plurality of conduction loops are electrically connected.

12. The semiconductor device of claim 2, wherein all end nodes of the first through fourth conduction loops are located in an end node region between the left-bottom corner region and the right-bottom corner region.

13. The semiconductor device of claim 2, wherein the first through fourth conduction loops have a common input end node.

14. The semiconductor device of claim 2, wherein the first and second conduction loops have a common first input end node, and the third and fourth conduction loops have a common second input end node.

15. The semiconductor device of claim 2, further comprising an input-output circuit electrically connected to respective end nodes of the first conduction loop, the second conduction loop, the third conduction loop and the fourth conduction loop, said input-output circuit comprising an output pad, and a selection circuit, which is configured to electrically connect the output pad sequentially to a first output end node of the first conduction loop, a second output end node of the second conduction loop, a third output end node of the third conduction loop, and a fourth output end node of the fourth conduction loop.

16. A defect detection structure in a peripheral region of a semiconductor die, which at least partially surrounds a central region of the semiconductor die in which a semiconductor integrated circuit is formed, the defect detection structure comprising:
   a first conduction loop passing through a left-bottom corner region of the peripheral region;
   a second conduction loop passing through a right-bottom corner region of the peripheral region;
   a third conduction loop passing through the left-bottom corner region and a left-upper corner region of the peripheral region;
   a fourth conduction loop passing through the right-bottom corner region and a right-upper corner region of the peripheral region; and
   a shielding loop to at least partially shield electrical interference between the first through fourth conduction loops.

17. In a semiconductor die, which includes: (i) a central region in which a semiconductor integrated circuit is formed, (ii) a peripheral region surrounding the central region, the peripheral region including a left-bottom corner region, a left-upper corner region, a right-upper corner region and a right-bottom corner region, and (iii) a defect detection structure in the peripheral region, the defect detection structure including a first conduction loop passing through the left-bottom corner region, a second conduction loop passing through the right-bottom corner region, a third conduction loop passing through the left-bottom corner region and the left-upper corner region, a fourth conduction loop passing through the right-bottom corner region and the right-upper corner region, and a shielding loop to at least partially shield electric interference between the first through fourth conduction loops, a method of detecting defects, comprising:
   applying a test input signal to an input end node of the defect detection structure;
   receiving first through fourth test output signals from first through fourth output end nodes of the first through fourth conduction loops; and
   identifying locations of defects in the semiconductor die based on the test input signal and the first through fourth test output signals.

18. The method of claim 17, wherein the first through fourth output signals are provided sequentially through an output pad on the semiconductor die.

19. The method of claim 17, wherein at least two of the first through fourth output signals are provided in parallel through at least two output pads on the semiconductor die.

20. The method of claim 17, wherein the locations of the defects are determined by comparing a delay time of the first test output signal and a delay time of the second test output signal; and wherein the locations of the defects are determined by comparing a delay time of the third test output signal and a delay time of the fourth test output signal.

* * * * *